United States Patent [19]

Kobayashi et al.

[11] Patent Number: 5,337,281
[45] Date of Patent: Aug. 9, 1994

[54] NON-VOLATILE SEMICONDUCTOR MEMORY DEVICE IN WHICH DATA CAN BE ERASED ON A BLOCK BASIS AND METHOD OF ERASING DATA ON A BLOCK BASIS IN NON-VOLATILE SEMICONDUCTOR MEMORY DEVICE

[75] Inventors: Kazuo Kobayashi; Makoto Yamamoto, both of Hyogo, Japan

[73] Assignee: Mitsubishi Denki Kabushiki Kaisha, Tokyo, Japan

[21] Appl. No.: 948,566

[22] Filed: Sep. 23, 1992

[30] Foreign Application Priority Data

Nov. 7, 1991 [JP] Japan .................. 3-291301

[51] Int. Cl.⁵ .............................. G11C 7/00
[52] U.S. Cl. ...................... 365/218; 365/185; 365/900
[58] Field of Search .............. 365/218, 230.03, 185, 365/189.05, 226, 900

[56] References Cited

U.S. PATENT DOCUMENTS 5,065,364 11/1991 Atwood .............................. 365/218
5,095,461 3/1992 Miyakawa ........................... 365/218

FOREIGN PATENT DOCUMENTS

4028575A1 3/1991 Fed. Rep. of Germany .
3-76098 4/1991 Japan .

OTHER PUBLICATIONS

Kynett et al., IEEE International Solid-State Circuits Conference, 1989 no month.

Primary Examiner—Eugene R. LaRoche
Assistant Examiner—A. Zarabian
Attorney, Agent, or Firm—Lowe, Price, LeBlanc & Becker

[57] ABSTRACT

In a flash EEPROM having source lines separately provided for memory cell array blocks, a Y decoder and a transfer control circuit are controlled in response to data supplied as a command indicating an erase mode so that a predetermined potential may only be supplied to a source line latch circuit provided corresponding to any one of the memory cell array blocks through a bit line in the one memory cell array block in the erase mode. Each source line latch circuit, in response to the predetermined potential, latches data instructing to supply a high potential to a source line in a corresponding memory cell array block. Accordingly, stored data in memory cell array can be erased on a block basis without increasing the number of interconnections and the circuit scale.

22 Claims, 9 Drawing Sheets

NON-VOLATILE SEMICONDUCTOR MEMORY DEVICE IN WHICH DATA CAN BE ERASED ON A BLOCK BASIS AND METHOD OF ERASING DATA ON A BLOCK BASIS IN NON-VOLATILE SEMICONDUCTOR MEMORY DEVICE

BACKGROUND OF THE INVENTION

1. Field of the Invention

The present invention generally relates to non-volatile semiconductor memory devices and, more particularly, relates to non-volatile semiconductor memory devices in which stored data in a memory cell array can be erased on a block basis.

2. Description of the Background Art

Semiconductor memory devices can be divided into volatile memories such as a DRAM (Dynamic Random Access Memory) and an SRAM (Static Random Access Memory), and non-volatile memories. If power is turned off, all the stored data in a volatile memory vanishes. Conversely, stored data in a non-volatile memory does not vanish even if power is turned off.

On example of such a non-volatile semiconductor memory device is an EEPROM (Electrically Erasable and Programmable Read Only Memory) where a user can write information, electrically erase the written information and rewrite another information. A flash EEPROM is an EEPROM where stored data in all the memory cells or stored data in the memory cells in one block can be erased collectively.

FIG. 7 is a cross-sectional view showing a structure of a memory cell in a flash EEPROM.

FIG. 6 is a circuit diagram showing a structure of a memory cell array 1 and a Y gate 2. A structure and operation of a conventional flash EEPROM will now be described with reference to FIGS. 5 to 7. A low-active signal will hereinafter be indicated by a reference designation with "/" added ahead of it.

Memory cell array 1 includes a plurality of memory cells MC arranged in a matrix of rows and columns. FIG. 6 shows, as representatives nine memory cells MC arranged in a matrix of three rows x three columns sharing the same input/output line in memory cell array 1 and circuitry related to them.

A FAMOS (floating gate avalanche injection MOS) transistor is used for each memory cell MC as shown in FIG. 7, where electric charge can be stored in a floating gate. In FIG. 6, each memory cell MC is indicated by a symbolic representation of a transistor.

The FAMOS transistor includes a control gate 17, a floating gate 16, N-type regions 18 and 19 formed on a P-type substrate 15 as source/drain and an insulating layer 20.

Floating gate 16 stretches over N-type regions 18 and 19 on P-type substrate 15 with insulating layer 20 interposed therebetween.

Control gate 17 is formed over floating gate 16 with insulating layer 20 interposed therebetween.

Control gate 17 and floating gate 16 are both formed of polysilicon.

Insulating layer 20 is an oxide film such as $SiO_2$.

The thickness of oxide film 20 between P-type substrate 15 and floating gate 16 is very small, i.e., normally in the order of 100Å.

The thickness of oxide film 20 between floating gate 16 and control gate 17 is normally in the order of 200Å, which is larger than that of the oxide film between floating gate 16 and P-type substrate 15.

As shown in FIG. 6, word lines WL1–WL3 and bit lines BL1–BL3 are provided in memory cell array 1, each word line corresponding to one of the memory rows and each bit line corresponding to one of the memory cell columns of the memory cell.

Control gates 17 of the FAMOS transistors making up each memory cell row are commonly connected to one corresponding word line. Drains 19 of the FAMOS transistors forming each memory cell column are commonly connected to one corresponding bit line. Sources 18 of the FAMOS transistors making up all the memory cells MC are commonly connected to one source line 28.

Referring to FIG. 7, in writing data, high potentials of 12 V and 6.5 V are applied to control gate 17 and drain 19 through corresponding word line and bit line while source 18 is grounded through source line 28.

The transistor is turned on by the voltage applied between control gate 17 and source 18 and a channel current flows between source 18 and drain 19. At this time, electron (hot electron)-hole pairs are generated in the vicinity of drain 19 because of ionization by collision. The holes flow to the side of the grounded substrate 15. Many of the electrons flow into drain 19 at a high potential. However, as the high potential is applied to control gate 17, part of the electrons are accelerated by the electric field between floating gate 16 and drain 19 and pass through insulating film 20 between floating gate 16 and substrate 15 to be injected in floating gate 16.

Since floating gate 16 is electrically insulated from control gate 17, source 18 and drain 19 by oxide film 20, the electrons injected in floating gate 16 do not flow outward. Accordingly, the electrons which have once been injected in floating gate 16 remain stored there for a long time without flowing out even after power is turned off.

States of electrons being stored and not stored in floating gate 16 correspond to data "0" and "1", respectively. Accordingly, the stored data in memory cell MC is held even after power is turned off.

When the electrons are stored in floating gate 16, the polarity of the region between source 18 and drain 19, that is, of the channel region is shifted to be positive. Accordingly, an inversion layer is not easily generated in the channel region. Therefore, if the electrons are stored in floating gate 16, a voltage to be applied to control gate 17 necessary for causing a channel current in this transistor (that is, the threshold voltage of the transistor) becomes higher than in the case where there is no electron stored in floating gate 16. That is, the transistor is not turned on unless a higher voltage is applied to control gate 17 than in the case where no electron is stored in floating gate 16.

Referring to FIG. 7, in erasing stored data, a high potential of 12 V is applied to source 18 through source line 28 while control gate 17 is grounded through a corresponding word line. Drain 19 is brought to a floating state.

A tunnel effect is caused by the high potential applied to control gate 17 and the electrons in floating gate 16 are extracted to source 18 through oxide film 20. Accordingly, the electrons injected into floating gate 16 in data writing are removed from floating gate 16. As a result, the threshold voltage of the transistor is decreased.

In reading data, a normal power supply potential Vcc (=5 V) is applied to control gate 17 through a corresponding word line and source 18 is grounded through source line 28 in FIG. 7.

If there is no electron stored in floating gate 16, a channel current flows between source 18 and drain 19 by the power supply potential 5 V applied to control gate 17 as the threshold voltage of this transistor is low. If there are electrons stored in floating gate 16, however, since the threshold voltage of the transistor is high, the power supply potential 5 V applied to control gate 17 causes no channel current to flow between source 18 and drain 19.

Accordingly, a transistor making up a memory cell having stored data of "1" is turned on in data reading, and passes current to source line 28 from a corresponding bit line. Conversely, since a transistor constituting a memory cell having stored data of "0" is in an OFF state when in data reading, it does not pass current to source line 28 from a corresponding bit line.

Therefore, in data reading, a sense amplifier detects whether or not current flows in a bit line corresponding to a memory cell having data to be read out. If current flows in the bit line, it is determined that the stored data is "1", while if no current flows in the bit line, it is determined that the stored data is "0".

A description will now be made of specific circuit operations in writing, erasing and reading data with reference to FIG. 6.

Firstly, a circuit operation in writing data will now be described.

A X decoder 4 selectively supplies a high potential Vpp of 12 V to any one of word lines WL1–WL3 in memory cell array 1.

Y gate 2 includes an input/output line 27 connected to a write circuit 70 and a sense amplifier 80 and N channel MOS transistors 26 provided as transfer gates between input/output line 27 and bit lines BL1–BL3 in memory cell array 1, respectively. The gates of transistors 26 are connected to a Y decoder 5 through different connecting lines Y1–Y3. That is, connecting lines Y1–Y3 are provided, having one to one correspondence to bit lines BL1–BL3.

Y decoder 5 selectively supplies a potential of a high level only to any one of connecting lines Y1–Y3 in order to turn on any one of transistors 26 in Y gate 2. As a result, only one of bit lines BL1–BL3 in memory cell array 1 which corresponds to the connecting line (any one of Y1–Y3) to which the potential of the high level was supplied, is electrically connected to input/output line 27.

Write circuit 70 is activated according to data supplied from input/output buffer 9 shown in FIG. 5 to apply a high voltage Vpp to input/output line 27. Since input/output line 27 is electrically connected to one bit line (any one of BL1–BL3) only, the high voltage Vpp applied to input/output line 27 from write circuit 7 is only supplied to the one bit line.

A source line switch 3 provides a ground potential to source line 28.

In writing data, input/output buffer 9 amplifies a data signal externally supplied to input/output terminals V00–V07 and supplies the same to write circuit 7.

As a result of such a circuit operation, a high potential is supplied to both control gate 17 and drain 19 only in one memory cell of memory cell array 1. Accordingly, hot electrons are generated and injected in floating gate 16 only in the one memory cell. That is, data "0" is written in the one memory cell MC.

For example, if X decoder 4 applies a high voltage Vpp to word line WL1, Y decoder 5 applies a potential of a high level to connecting line Y1 and write circuit 70 is activated, data "0" is written in the memory cell MC surrounded by the dotted line in the figure.

If data supplied from input/output buffer 9 to write circuit 70 in FIG. 5 is "1", write circuit 70 is not activated. Accordingly, in such a case, one bit line (any one of BL1–BL3) corresponding to one connecting line (any one of Y1–Y3), to which the potential of high level is supplied by Y decoder 5, does not attain a high potential. Therefore, no hot electron which can be injected in floating gate 16 is generated in the one memory cell MC having drain 19 and control gate 17 connected to the one bit line and one word line (any one of WL1–WL3) to which the high voltage Vpp is applied by X decoder 4, respectively. Accordingly, the stored data in the memory cell MC remains "1".

As described above, in writing data, X decoder 4 and Y decoder 5 select one word line and one bit line, respectively, and write circuit 70 supplies a high potential to the selected bit line according to data from input/output buffer 9, so that external data is written in one memory cell MC.

A description will now be made of a circuit operation in erasing data.

X decoder 4 is deactivated and all the word lines WL1–WL3 in memory cell array 1 attain a ground potential Vss. The control gates 17 of the all the memory cells MC thereby attain the ground potential.

Similarly, Y decoder 5 is also deactivated, so that connecting lines Y1–Y3 connected to all the transistors 26 in Y gate 2 attain a potential of a low level. As a result, all the transistors 26 in Y gate 2 are turned off, so that drains 19 of all the memory cells MC are brought to the floating state.

Source line switch 3 provides a high voltage Vpp to source line 28.

Such a circuit operation described above generates high electric fields between floating gates 16 and sources 18 with sources 18 being at a higher potential so that the tunnel effect is caused, in all the memory cells MC. Therefore, the electrons flow out from floating gates 16 in all the memory cells MC. That is, the stored data in the all the memory cells MC within memory cell array 1 is erased collectively.

A circuit operation in reading data will now be described.

X decoder 4 brings the potential of only one of word lines WL1–WL3 in memory cell array 1 to a high level and the potentials of other word lines to a low level. As a result, 5 V is applied to control gate 17 of every memory cell connected to the one word line.

Y decoder 5 supplies a potential of a high level only to the gate of one of transistors 26 in Y gate 2. As a result, only one bit line (any one of BL1–BL3) connected to the one transistor 26 is electrically connected to sense amplifier 8 through input/output line 27.

Source line switch 3 grounds source line 28 in the same way as in writing data.

According to such a circuit operation described above, sense amplifier 80 reads out data in one memory cell MC having drain 19 and control gate 17 connected to the one transistor 26 which is turned on by Y decoder 5 and the one word line to which the potential of the high level is supplied by X decoder 4, respectively.

Suppose a case where a potential of a high level is supplied to connecting line Y1 and word line WL1. In such a case, whether or not current flows in bit line BL1 electrically connected to input/output line 27 depends on stored data in memory cell MC surrounded by the dotted line in the figure.

That is, since the threshold voltage of a memory cell having stored data "1" is higher than the potential Vss of the low level, memory cells having their control gates connected to word lines WL2 and WL3 at the potential of the low level are in the OFF state regardless of their stored data. Conversely, the potential Vcc of the high level is higher than the threshold voltage of a memory cell having stored data of "1" and lower than the threshold voltage of a memory cell having stored data of "0". Accordingly, the stored data of the memory cell determines whether the memory cell having the control gate connected to word line WL1 at the potential of a high level is in an ON or OFF state.

Therefore, if the stored data of memory cell MC surrounded by the dotted line in the figure is "0", memory cell MC is in the OFF state, so that no current flows from input/output line 27 to source line 28 through transistor 26 having its gate connected to connecting line Y1, bit line BL1 and the memory cell MC. If the stored data of the memory cell MC is "1", the memory cell MC is in the ON state, so that current flows from input/output line 27 to source line 28 through transistor 26 having its gate connected to connecting line Y1, bit line BL1 and the memory cell MC.

If current flows from the bit line electrically connected to input/output line 27 to source line 28, the potential on input/output line 27 is decreased, while if no current flows from the bit line electrically connected to input/output line 27 to source line 28, the potential on input/output line 27 is not decreased. Sense amplifier 80 detects whether or not current flows in the bit line electrically connected to input/output line 27 by detecting such a change of the potential on input/output line 27.

If no current flows in the bit line electrically connected to input/output line 27, sense amplifier 80 supplies a voltage signal corresponding to data "0" to input/output buffer 9 of FIG. 5. If current flows in the bit line electrically connected to input/output line 27, sense amplifier 80 applies a voltage signal corresponding to data "1" to input/output buffer 9 of FIG. 5.

In reading data, input/output buffer 9 provides the data signal supplied from sense amplifier 8 to input/output terminals VO0–VO7.

A description will now be made of an overall circuit operation of a flash EEPROM.

In FIG. 5, a control signal buffer 14 buffers each external control signal /WE, /OE, /CE and generates an internal control signal necessary for controlling other circuitry.

In the flash EEPROM, writing and erasing modes are set according to a combination of externally applied input signals. That is, a mode is set according to input data at the time of the rise of a write enable signal /WE.

In writing, firstly, a normal driving voltage Vcc and a high voltage Vpp are raised to their original values. Then, the write enable signal /WE is caused to fall. The data signal externally supplied to input/output terminals VO0–VO7 is latched in a command register 12 through input/output buffer 9, synchronizing with the rise of the write enable signal /WE. This data signal is then decoded by a command decoder 13, so that the operation mode of the flash EEPROM is set to a program mode for data writing.

Then, the write enable signal /WE is made to fall again and an externally applied address signal is latched in address register 6. Furthermore, a data signal $D_{IN}$ externally supplied to input/output terminals VO0–VO7 is latched in a write circuit group 7 through input/output buffer 9 in response to the rise of the write enable signal /WE.

After that, a pulse of a high voltage Vpp is generated from a program voltage generating circuit 10 and supplied to X decoder 4 and Y decoder 5. Y decoder 5 supplies this high voltage pulse to only the gate of one of the transistors 26 in Y gate 2, which is connected to one bit line provided corresponding to a memory cell column designated by the address signal latched in address register 6. X decoder 4 supplies this high voltage pulse to only one word line provided corresponding to a memory cell row designated by the address signal latched in address register 6. As a result, data latched in write circuit group 7 is written in only one memory cell MC within memory cell array 1 in the manner described above.

The write enable signal /WE is then made to fall and the data signal externally supplied to input/output terminals VO0–VO7 is latched in command register 12. Subsequently, a program verify mode is set in synchronization with the rise of the write enable signal /WE, for verifying whether or not the data has been written correctly. At this time, a verify voltage generating circuit 11 generates a voltage higher than a voltage 5 V which is supplied to a control gate of memory cell MC when data is normally read out, i.e. about 6.5 V as a so-called program verify voltage, by using a high voltage Vpp and supplies the same to X decoder 4 and Y decoder 5.

X decoder 4 supplies the program verify voltage to one word line provided corresponding to a memory cell row designated by the address signal latched in address register 6. Similarly, Y decoder 5 supplies the program verify voltage to the gate of one transistor 26 in Y gate 2, which is connected to one bit line provided corresponding to a memory cell column designated by the address signal latched in address register 6. As a result, in such a manner as described above, a sense amplifier group 8 reads out stored data in one memory cell MC connected commonly to the memory cell row and the memory cell column designated by the address signals latched in address register 6.

However, since a higher potential than in normal reading is applied to the control gate of the memory cell from which the data is to be read, even if the memory cell has data "0" written therein, the memory cell is turned on and data "1" is read out by sense amplifier group 8 when its threshold voltage does not become sufficiently high. That is, verify voltage generating circuit 11 generates such a program verify voltage in order to facilitate detection of so called poor writing where sufficient electrons are not injected into a floating gate of a memory cell in writing data of "0" and the threshold voltage of the memory cell is not shifted to be high enough.

Then, if the data read out by sense amplifier group 8 does not coincide with the data latched in write circuit 7, the above-described circuit operation is repeated and data is written again in the same memory cell as stated above. If the data read out by sense amplifier 8 coincides with the data latched in write circuit group 7, then it may be determined that the data has been written correctly, so that data writing and program verification are carried out for a memory cell in the next address. Then, when data writing and program verification are finished for all the memory cells, command decoder 13 sets the flash EEPROM to a read mode where a circuit operation for normal data reading can be performed.

In an EEPROM, data is erased by supplying a high voltage between control gate 17 and source 18 of a memory cell to force the curve of the energy band between floating gate 16 and source 18 so that the electrons tunnel from floating gate 16 to source 18 so that the election tunnel from floating gate 16 to source 18.

However, it is practically difficult to decrease the threshold voltages of all the memory cells MC to the same value even if a high voltage for erasing data is supplied to all the memory cells MC in memory cell array 1 at once.

That is, in some of the memory cells to which the high voltage is supplied collectively for erasing data, the electrons injected when writing data "0" are completely removed from floating gate 16 while in some of other memory cells, more electrons than those injected when writing data "0" are extracted from floating gate 16 and less electrons than those injected when writing data "0" are removed from the floating gate in some other memory cells.

The phenomenon where more electrons than injected by data writing are extracted from the floating gate is called "overerasing".

As described above, overerasing inverts the polarity of the threshold voltage of the memory cell to be negative, causing difficulties to subsequent data reading and writing. Therefore, a method as described below is currently used for avoiding such overerasing.

That is, a pulse width of a high voltage pulse to be applied to source line 28 for data erasing is decreased. Every time the high voltage pulse having the small pulse width is applied to source line 28, data stored in all the memory cells MC in memory cell array 1 is read out and it is verified whether or not all the data is "1". Then, if at least one memory cell which does not have stored data "1" is detected, the high voltage pulse having the small pulse width as described above is applied to source line 28 again.

Erase verification means verifying whether or not data stored in each memory cell MC is "1", that is, data stored in each memory cell has completely been erased by applying the high voltage pulse for data erasing to source line 28.

Such erase verification and application of the high voltage pulse for data erasing to source line 28 are repeated until data in all the memory cells MC within memory cell array 1 is completely erased.

A circuit operation of the entire flash EEPROM for data erasing will now be described.

Firstly, a normal power supply voltage Vcc and a high voltage Vpp rise. Subsequently, data "0" is written in all the memory cells in memory cell array 1 by repeating a circuit operation in a program mode for all the addresses in memory cell array 1.

Then, a write enable signal /WE falls and a data signal externally supplied to input/output terminals VO0-VO7 is latched in command register 12 through input/output buffer 9. This means that an erase command which is an instruction indicating erasing of the stored data in memory cell array 1 is supplied to the flash EEPROM.

Subsequently, command decoder 13 decodes the data signal indicating the erase command latched in command register 12 and sets the flash EEPROM in an erase mode for erasing the stored data in memory cell array 1.

Once the flash EEPROM is set in the erase mode, source line switch 3 supplies a high voltage Vpp to source line 28 in memory cell array 1 for a short period of time from the fall to the rise of the write enable signal /WE. As a result, in the manner as described above, the tunnel effect is caused and the electrons are extracted from the floating gate to the source in each memory cell MC of memory cell array 1.

At the rise of the write enable signal /WE when application of the high voltage Vpp to source line 28 is finished, an address signal indicating a read start address in memory cell array 1 is latched in address register 6 independently of the external address signal.

A data signal externally applied to input/output terminals VO0-VO7 is latched in command register 12 through input/output buffer 9 in response to the rise of the write enable signal /WE, as an erase verification command instructing to perform a circuit operation for verifying whether or not the stored data in memory cell array 1 has completely been erased. Command decoder 13 decodes the data signal latched in command register 12 and sets the flash EEPROM in the erase verification mode for verifying whether or not the stored data in memory cell array 1 has completely been erased.

Once the flash EEPROM is set in the erase verification mode, verification voltage generating circuit 11 generates a voltage a little lower than the voltage of 5 V to be supplied to the control gate of the memory cell in normal data reading and provides the same to X decoder 4 and Y decoder 5.

X decoder 4 supplies the little lower voltage to one word line provided corresponding to a memory cell row designated by the address signal latched in address register 6. Similarly, Y decoder 5 only supplies the little lower voltage to the gate of one connected to one bit line provided corresponding to a memory cell column designated by the address signal latched in address register 6, out of transistors 26 within Y gate 2. Accordingly, stored data in one memory cell MC designated by the address signal latched in address register 6 is read out by sense amplifier group 8 on the same principle as in the normal data reading.

However, as the potential supplied to the control gate of the memory cell from which the data is to be read out is lower than in normal data reading, the memory cell MC is never turned on and the data read out by sense amplifier group 8 never becomes data "1" unless the threshold voltage of the memory cell MC is shifted to a sufficiently low value by the data erasing stated above.

If the electrons injected into the floating gate of memory cell MC are not completely removed even by the circuit operation for the data erasing described above, the threshold voltage of the memory cell MC is not fully decreased. However, if the voltage supplied to the control gate is high in some degree, which is equal to or higher than the threshold voltage, memory cell MC is turned on in spite of insufficient data erasing. If the voltage supplied to the control gate is low, only memory cells each having the sufficiently low threshold voltage are turned on.

In order to more surely verify of whether or not store data in each memory cell MC has completely been erased, a voltage supplied to the control gate for reading out data in the erase verification mode is set lower than in the normal data reading.

If data read out by sense amplifier group 8 is "0", it can be determined that the stored data in memory cell MC designated by the address signal currently being latched in address register 6 has not completely been erased yet, so that the circuit operations for supplying a high voltage Vpp for data erasing and reading data for erase verification are repeated again.

If the data read out by sense amplifier group 8 is "1", it can be determined that the data stored in the memory cell designated by the address signal currently being latched in address register 6 has been completely erased. In this case, if the address signal latched in address register 6 does not designate the last address in memory cell array 1, the address signal latched in address register 6 is incremented and the circuit operation described above is repeated.

After these circuit operations, when the address signal latched in address register 6 designates the last address in memory cell array 1, command register 12 sets the flash EEPROM in the normal data read mode since it can be determined that the stored data in all the memory cells MC in memory cell array 1 has completely been erased.

As stated above, in the flash EEPROM of the background art, since the sources of the all the memory cells in the memory cell array are connected to the same source line to which an erase pulse is to be supplied, stored data in all the memory cells within the memory cell array is erased collectively by a single data erasing. As a result, data erasing is not carried out on a byte basis as in data writing and data reading but is performed for all the bits at the same time.

If data has already been written in the memory cell array and the data is to be rewritten into new data, the data must be erased from the memory cell array prior to writing the new data. However, because data erasing is performed collectively for all the memory cells, even if stored data in some ones of the memory cells are only desired to be rewritten, stored data in all the memory cells are erased before the data rewriting. Accordingly, it is necessary to write the same data as before erasing into memory cells of which stored data are not desired to be rewritten.

That is, even if stored data of part of only some ones of the memory cells is to be rewritten, data is newly written into all the memory cells. As a result, a longer time is required to rewrite data.

Additionally, since data of each memory cell can be rewritten only a limited number of times, it is unpreferable that an electrical stress by application of high voltage for data erasing and writing is uselessly put on the memory cells. Accordingly, in this respect as well, in rewriting data, application of an erase pulse and a write pulse to a memory cell where it is unnecessary to rewrite its stored data should be avoided.

Japanese Patent Laying-Open No. 3-76098, for example, has proposed a flash EEPROM in which data erasing can be performed on a basis of a predetermined number of memory cells. FIG. 8 is a schematic block diagram showing one example which can easily be thought of as a structure of such a flash EEPROM.

Referring to FIG. 8, in this flash EEPROM, a memory cell array 1 is divided into m blocks 1-0 to 1-(m−1). A source line decoder 20 controls a source line switch group 3 in response to an address signal from an address register 6 so that an erase pulse is applied only to any one of these blocks 1-0 to 1-(m−1) from source line switch group 3. As the structure and operation of other portions in this flash EEPROM are the same as that of the prior art shown in FIG. 5, the description thereof will not be repeated here.

A description will now be made of a structure of memory cell array 1 and its peripheral circuitry and a circuit operation of the peripheral circuitry when erasing data in this flash EEPROM, with reference to FIG. 9.

FIG. 9 shows the structure of memory cell array 1 and its peripheral circuitry supposing that there are two memory cell rows in each of the blocks 1-0 to 1-(m−1) and the number (n+1) of bits in input/output data $D_0$ to $D_n$ is 2. FIG. 9 only shows two blocks 1-0 and 1-1 among blocks 1-0 to 1-(m−1) forming memory cell array 1 and corresponding peripheral circuits as representatives in order to simplify the figure.

A Y gate 2 includes the same number of input/output lines 52 and 53 as that of bits of input/output data $D_0$-$D_n$ and N channel MOS transistors 56–59 provided between each input/output line and respective memory cell array blocks 1-0 to 1-(m−1).

External terminals for receiving input/output data $D_0$-$D_n$ in FIG. 8 are provided one to one correspondence with all the input/output lines in Y gate 2. That is, in reading data, at each external terminal, data according to a detection result of a sense amplifier connected to a corresponding input/output line appears, and in writing data, to each external terminal, write data to be written in a memory cell connected to a corresponding input/output line is externally applied. As a result, data of a predetermined bit length is collectively written in any one of the memory cell blocks and data of a predetermined bit length is collectively read out from one memory cell array block.

That is, all the memory cells that can be electrically connected to an input/output line deal with write data and read data of the same bit.

For example, referring to FIG. 9, four memory cells 31, 32, 35 and 36 connected to transistors 56 and 58 provided corresponding to input/output line 52 and four memory cells 33, 34, 37 and 38 connected to transistors 57 and 59 provided corresponding to input/output line 53 are provided for writing and reading data $D_0$ of the least significant bit and data $D_1$ of the most significant bit, respectively.

A sense amplifier group 8 includes sense amplifiers 48 and 49 provided corresponding to input/output lines 52 and 53 in Y gate 2, respectively. Similarly, a write circuit group 7 includes write circuits 50 and 51 provided corresponding to input/output lines 52 and 53 in Y gate 2, respectively.

Each of memory cell array blocks 1-0 to 1-(m−1) includes the same number of bit lines 60 and 61 (62 and 63) as that of input/output lines 52 and 53. The bit lines in each memory cell array block are connected to corresponding two of transistors 56–59 in Y gate 2, respectively.

That is, one bit line 60 in memory cell array block 1-0 and one bit line 62 in memory cell array block 1-1 are connected to the same input/output line 52 through transistors 56 and 58, and another one bit line 61 in memory cell array block 1-0 and another one bit line 63 in memory cell array block 1-1 are connected to another one input/output line 53 through transistors 57 and 59, respectively.

Every two of transistors 56–59 in Y gate 2 corresponding to the same memory cell array block are collectively controlled by Y decoder 5.

That is, the gates of transistors 56 and 57 provided corresponding to memory cell array block 1-0 are connected to Y decoder 5 through the same signal line Y1 and the gates of transistors 58 and 59 provided corresponding to memory cell array block 1-1 are connected to Y decoder 5 through one signal line Y2 different from the signal line Y1.

Y decoder 5 supplies a potential of a high level only to either of signal lines Y1 and Y2 connected to the gates of transistors 56–59 in Y gate 2 when writing and reading data. Accordingly, when reading and writing data, only two of transistors 56–59 in Y gate 2, corresponding to any one of the memory cell array blocks, are turned on and electrically connect the bit lines in the one memory cell array block to input/output lines 52 and 53.

In reading data, sense amplifiers 48 and 49 operated so as to detect whether or not there is current flowing in corresponding input/output lines 52 and 53.

In writing data, each of write circuits 50 and 51 operates so as to selectively provide a high voltage Vpp to corresponding input/output line (52 or 53) according to externally applied write data. X decoder 4 also operates to control the potentials on word lines WL1 and WL2 in the same way as in the flash EEPROM shown in FIG. 5.

Word lines WL1 and WL2 are commonly provided for all the memory cell array blocks 1-0 to 1-(m−1).

Accordingly, in writing data, if a high potential Vpp is supplied to any one of the word lines, two memory cells connected to the one word line in each of memory cell array blocks 1-0 to 1-(m−1) are brought to a data writable state. However, as Y gate portion 2 controls Y decoder 5 so that bit lines in any one of the memory cell array blocks are only electrically connected to input-/output lines 52 and 53, the external data is written in only those belonging to the one memory cell array block among the memory cells connected to the one word line to which the high potential Vpp is provided.

For example, if Y decoder 5 supplies a potential of a high level to signal line Y1 and X decoder 4 supplies a high potential Vpp to word line WL1, memory cells 31 and 33 in memory cell array block 1-0 are brought to the data writable state and the potentials on input/output lines 52 and 53 are transmitted to bit lines 60 and 61 through transistors 56 and 57 in an ON state. Accordingly, data is written in memory cells 31 and 33, respectively.

In reading data, X decoder 4 supplies a potential of a high level to any one of the word lines, so that all the memory cells connected to the word line in each of memory cell array blocks 1-0 to 1-(m−1) are brought to a data readable state. However, in reading out data as well, as bit lines in any one of the memory cell array blocks are only electrically connected to input/output lines 52 and 53, data is read out only from the one memory cell array block.

For example, if Y decoder 5 supplies a potential of a high level to signal line Y1 and X decoder 4 supplies a potential of a high level to word line WL1, each of the transistors 31, 33, 35 and 37 connected to word line WL1 in each of memory cell array blocks 1-0 to 1-(m−1) is turned on or off according to the stored data. However, only the bit lines 60 and 61 connected to two memory cells 31 and 33 belonging to memory cell array block 1-0 are electrically connected to input/output lines 52 and 53 through transistors 56 and 57 in the ON state. Accordingly, whether there is a current flowing in input/output lines 52 and 53 depends on the stored data in memory cells 31 and 33 in memory cell array block 1-0, respectively.

In this way, in reading data as well, data is read out only from any one of the memory cell array blocks.

Source line switch group 3 includes source line switches 43 and 44 provided corresponding to all the memory cell array blocks 1-0 to 1-(m−1), respectively.

Source lines 281 and 282 are provided individually for memory cell array blocks 1-0 to 1-(m−1). The sources of all the memory cells in each memory cell array block are connected to a corresponding source line switch through a corresponding source line.

Each of source line switches 43 and 44 is controlled by a source line decoder 20 and, in writing and reading data, operates in the same way as source line switch 3 in the flash EEPROM of FIG. 5. In erasing data, each source line switch is controlled by source line decoder 20 to selectively provide a high potential Vpp to the source line of a corresponding memory cell array block.

More specifically, if a command decoder 13 indicates the data erase mode, source line decoder 20 decodes an address signal from address register 6, and supplies a control signal for instructing either one of source line switches 43 and 44 in source line switch group 3 to generate a high potential Vpp and the other source switches not to generate such a high potential Vpp. As a result, since the high potential Vpp is generated only from one source line switch, the high potential Vpp is only supplied to the source line in the one memory cell array block provided corresponding to the one source line switch.

As X decoder 4 and Y decoder 5 operate in the same way as in the flash EEPROM of the prior art shown in FIG. 5, the control gates of all the memory cells are grounded and their drains are brought to a floating state in all the memory cell array blocks 1-0 to 1-(m−1). Therefore, data stored in all the memory cells in the one memory cell array block corresponding to the one source line switch generating the high potential Vpp is collectively erased while data stored in the memory cells within other memory cell array blocks is not erased.

For example, referring to FIG. 9, if source line decoder 20 instructs source line switch 43 to generate a high potential Vpp, source line switch 43 supplies the high potential Vpp to source line 281 while source line switch 44 does not supply the potential Vpp to the other source line 282. As a result, referring to FIG. 9, the tunnel effect is only caused between the sources and floating gates in memory cells 31 to 34 within memory cell array block 1-0 and data stored in these memory cells is erased collectively. Conversely, none of memory cells 34–38 in memory cell array block 1-1 has the source-floating gate voltage high enough to cause the tunnel effect, so that no data is erased from these memories.

An address signal, decoding of which makes it possible to specify any one of the memory cell array blocks, is supplied to source line decoder 20. For example, if data indicating which memory cell block includes a memory cell where data is to be written or read out is contained in most significant bits in data of a plurality of bits forming an externally applied address signal, those corresponding to the data of some of most significant bits among output signals of address register 6 shown in FIG. 8 may be supplied to source line decoder 20.

As stated above, according to this flash EEPROM, stored data in memory cell array 1 can be erased on a block basis. Accordingly, in rewriting the stored data in memory cell array 1, data stored in a block including a memory cell where it is necessary to change the stored data is only erased, if an external address signal is set so that no high potential Vpp may be generated from a source line switch provided corresponding to a block where it is not necessary to change stored data.

As described above, the conventional flash EEPROM where stored data can be erased on a block basis requires a source line decoder which uses an address signal as an input, in order to control a source line switch provided for each memory cell array block.

The source line decoder must decode an external address signal to supply to any one of the source line switches, a control signal for instructing to generate a high potential Vpp. Therefore, the source line decoder must include circuits provided corresponding to all the source line switches, and each adapted to generate a control signal instructing to generate a high potential Vpp in response to a specific address input only, and it is necessary to separately provide signal lines between these circuits and corresponding source line switches.

For example, referring to FIG. 9, source line decoder 20 includes a decoder 200 adapted to generate a control signal instructing to generate a high potential Vpp only when an address signal designating any of memory cells 31 to 34 in memory cell array block 1-0 is supplied as an input, and a decoder 210 adapted to generate a control signal instructing to supply a high potential Vpp only when an address signal for selecting any of memory cells 35 to 38 in memory cell array block 1-1 is supplied as an input. There are separately provided a signal line 46 for providing the output of decoder 200 to source line switch 43 and a signal line 47 for providing the output of decoder 210 to source line switch 44.

Practically, since one memory cell array is divided into a multiplicity of blocks, the same number of signal lines as that of these blocks must be provided between source line switch group 3 and source line decoder 20 and the same number of decoders as that of these signal lines must be provided in source line decoder 20.

Since each decoder in source line decoder 20 practically receives, as an input, data of a multiplicity of bits in data of a plurality of bits constituting an external address signal, it has a relatively large circuit area. Accordingly, a large area on the semiconductor substrate is occupied by source line decoder 20 and the signal lines provided between source line decoder 20 and source line switch group 3. As a result, the chip size of such a conventional flash EEPROM is increased, which goes against the general need for a reduced chip size of a semiconductor integrated circuit device.

SUMMARY OF THE INVENTION

An object of the present invention is to provide a non-volatile semiconductor memory device where stored data in a memory cell array can be erased on a block basis without increasing its chip size.

Another object of the present invention is to enable data erasing on a block basis in a non-volatile semiconductor memory device, using a smaller number of signal lines than in the prior art.

Still another object of the present invention is to enable data erasing on a block basis in a non-volatile semiconductor memory device by adding smaller circuitry than in the prior art.

Yet another object of the present invention is to reduce the chip size of a non-volatile semiconductor memory device where data can be erased on a block basis.

In accordance with one aspect, a non-volatile semiconductor memory device according to the present invention includes a plurality of memory cell array blocks, data bus to which a potential according to write data is to be provided, and a plurality of first connecting circuitry and a plurality of high voltage generating circuitry provided corresponding to the plurality of memory cell array blocks. Each memory cell array block includes a plurality of memory cells arranged in a plurality of columns, each memory cell where data can be electrically written and erased, and a plurality of bit lines provided corresponding to the plurality of columns. Each first connecting circuitry electrically connects the plurality of bit lines in a corresponding memory cell array block to the data bus. Each high voltage generating circuitry generates a high voltage for collectively erasing stored data in all the memory cells within a corresponding memory cell array block.

The non-volatile semiconductor memory device according to the present invention further includes potential supply circuitry responsive to an instruction signal designating a data erase mode for supplying a predetermined potential to the data bus, activation circuitry for selectively activating any of the plurality of connecting circuitry in the data erase mode, and second connecting circuitry for electrically connecting each high voltage generating circuitry to a predetermined one of the plurality of bit lines within a corresponding memory cell array block in the data erase mode. Each high voltage generating circuitry is activated in response to the bit line connected by the second connecting circuitry attaining the predetermined potential.

In accordance with the non-volatile semiconductor memory device, as any of the connecting circuitry is selectively activated by the activation circuitry in the data erase mode, the potential supplied to the data bus in response to the signal indicating the erase mode is transmitted only to one bit line in a memory cell array block corresponding to the activated connecting circuitry. Therefore, the high voltage generating circuitry provided corresponding to the memory cell block is only activated. As a result, stored data in the memory cells within the memory cell array block provided corresponding to the activated connecting circuitry is erased collectively by the high voltage generated by the corresponding high voltage generating circuitry.

In accordance with another aspect, a non-volatile semiconductor memory device according to the present invention includes a plurality of memory cell array blocks each including a plurality of memory cells arranged in a plurality of columns and rows, each memory cell in each of which data can be electrically written and erased, a plurality of bit lines provided corresponding to the plurality of columns and a plurality of word lines provided corresponding to the plurality of rows, a data bus to which a potential according to externally applied write data is to be provided in writing data, a plurality of first connecting circuitry provided corresponding to the plurality of memory cell array blocks each for electrically connecting a plurality of bit lines in a corresponding memory cell array block to the data bus, and a plurality of high voltage generating circuitry provided corresponding to the plurality of memory cell array blocks each for generating a high voltage for collectively erasing stored data in plurality of memory cells within a corresponding memory cell array block.

The non-volatile semiconductor memory device further includes potential supply circuitry for supplying a predetermined potential to the data bus in the data erase mode, first decode circuitry for decoding an address signal so as to generate a signal for activating any of the plurality of first connecting circuitry and the deactivating all the other first connecting circuitry in each of the data write mode, the data read mode and the data erase mode, second connecting circuitry for electrically connecting each of the plurality of high voltage generating circuitry to a predetermined one of the plurality of bit lines in a corresponding memory cell array block in the data erase mode, and second decode circuitry for decoding an address signal so as to select any of the plurality of word lines in each of the plurality of memory cell array blocks in the data write mode and the data read mode and so as to bring all the plurality of word lines in each of the plurality of memory cell array blocks to a non-selected state in the data erase mode.

Each of the plurality of high voltage generating circuitry is activated in response to the bit line connected by the second connecting circuitry attaining the predetermined potential.

In accordance with the non-volatile semiconductor memory device, the first decode circuitry for selecting a bit line to be electrically connected to the data bus is operated also in the data erase mode unlike in the prior art. Therefore, the predetermined potential supplied to the data bus in the data erase mode is provided only to high voltage generating circuitry corresponding to the memory cell array block including the selected bit line so as to activate the same.

In accordance with still another aspect, the present invention relates to a method of erasing data on a block basis in a non-volatile semiconductor memory device including a plurality of memory cell array blocks having a plurality of memory cells each arranged in a plurality of columns and rows, each memory cell in each of which data can be electrically written and erased, a plurality of bit lines provided corresponding to the plurality of columns and a plurality of word lines provided corresponding to the plurality of rows, a data bus to which a potential according to externally applied write data is to be provided, a plurality of connecting circuitry provided corresponding to the plurality of memory cell array blocks each for electrically connecting said plurality of bit lines in a corresponding memory cell array block to the data bus and a plurality of high voltage generating circuitry provided corresponding to the plurality of memory cell array blocks each for generating a high voltage for collectively erasing stored data in the plurality of memory cells within a corresponding memory cell array block. The method includes the steps of supplying a predetermined signal to the data bus, driving all the plurality of word lines to a predetermined low potential, selectively activating any of the plurality of connecting circuitry, electrically connecting each of the plurality of high voltage generating circuitry to the bit lines in a corresponding memory cell array block, and activating high voltage generating circuitry corresponding to the memory cell array block including the bit line to which the predetermined signal is supplied through the activated connecting circuitry.

In accordance with the method, each high voltage generating circuitry supplies a high voltage for erasing data to a corresponding memory cell array block when a predetermined signal is supplied to the bit line in the corresponding memory cell array block from the data bus.

Therefore, in accordance with the present invention, stored data in a memory cell array in a non-volatile semiconductor memory device can be erased on the basis of an arbitrary number of blocks by adding a small number of interconnections and circuitry. Additionally, even if the number of blocks is increased, the number of interconnections related to the data erasing is not increased, so that it is also possible to selectively erase or rewrite the stored data in the memory cell array on a smaller-unit basis without increasing its chip size.

Therefore, if the present invention is applied to a flash EEPROM, for example, a non-volatile semiconductor memory device with much improved performance than in the prior art can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
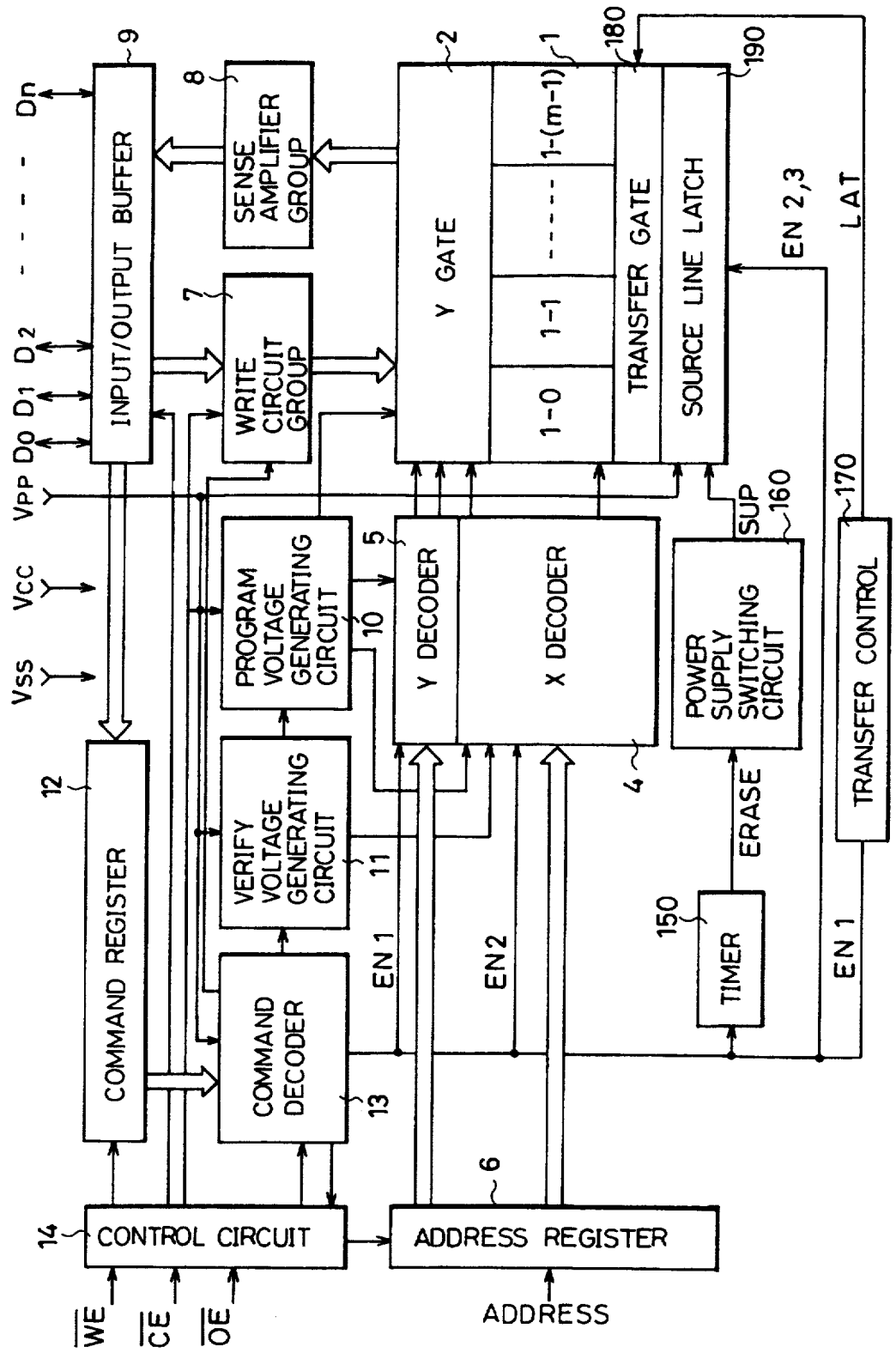
FIG. 1 is a schematic block diagram showing an overall structure of a flash EEPROM according to one embodiment of the present invention.

FIG. 1 is a schematic block diagram showing the overall structure of a flash EEPROM in accordance with one embodiment of the present invention.

Figure 8:
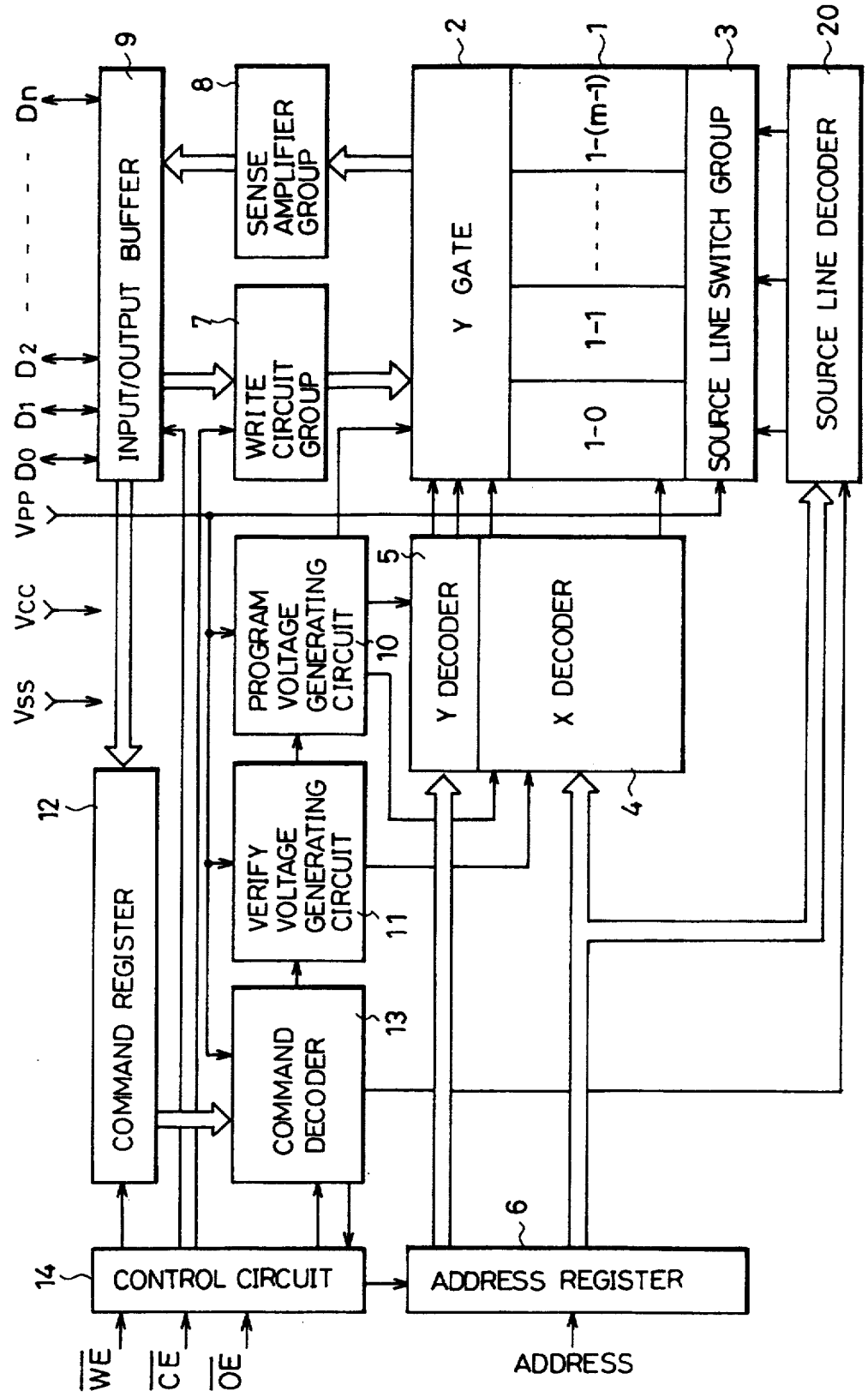
FIG. 8 is a schematic block diagram showing an overall structure of the flash EEPROM in the prior art where data can be erased on a block basis.

Referring to FIG. 1, this flash EEPROM, unlike the conventional one shown in FIG. 8, includes a source line latch portion 190 and a transfer gate 180 for erasing stored data in a memory cell array 1 on a block basis. Transfer gate 180 is provided between memory cell array 1 and source line latch portion 190 for controlling electrical connection therebetween.

A timer 150 and a power supply switching circuit 160 are provided for controlling source line latch portion 190 and a transfer control circuit 170 is provided for controlling transfer gate 180.

Furthermore, in this flash EEPROM, unlike the one shown in FIG. 8, a Y decoder 5 operates in the same way in the erase mode as in data writing and data reading, a X decoder 4 is deactivated in the erase mode and a write circuit 7 supplies external data received through an input/output buffer 9 to a Y gate 2 in the erase mode. A command decoder 13 has a function, as well as the conventional function, of controlling X decoder 4, Y decoder 5 and write circuit group 7 so that they operate in the manner described above, and generating control signals EN1 to EN3 for controlling timer 150, transfer control circuit 170 and source line latch portion 190.

The structure and operation of other portions in this flash EEPROM are the same as those of the prior art shown in FIG. 8.

Figure 2:
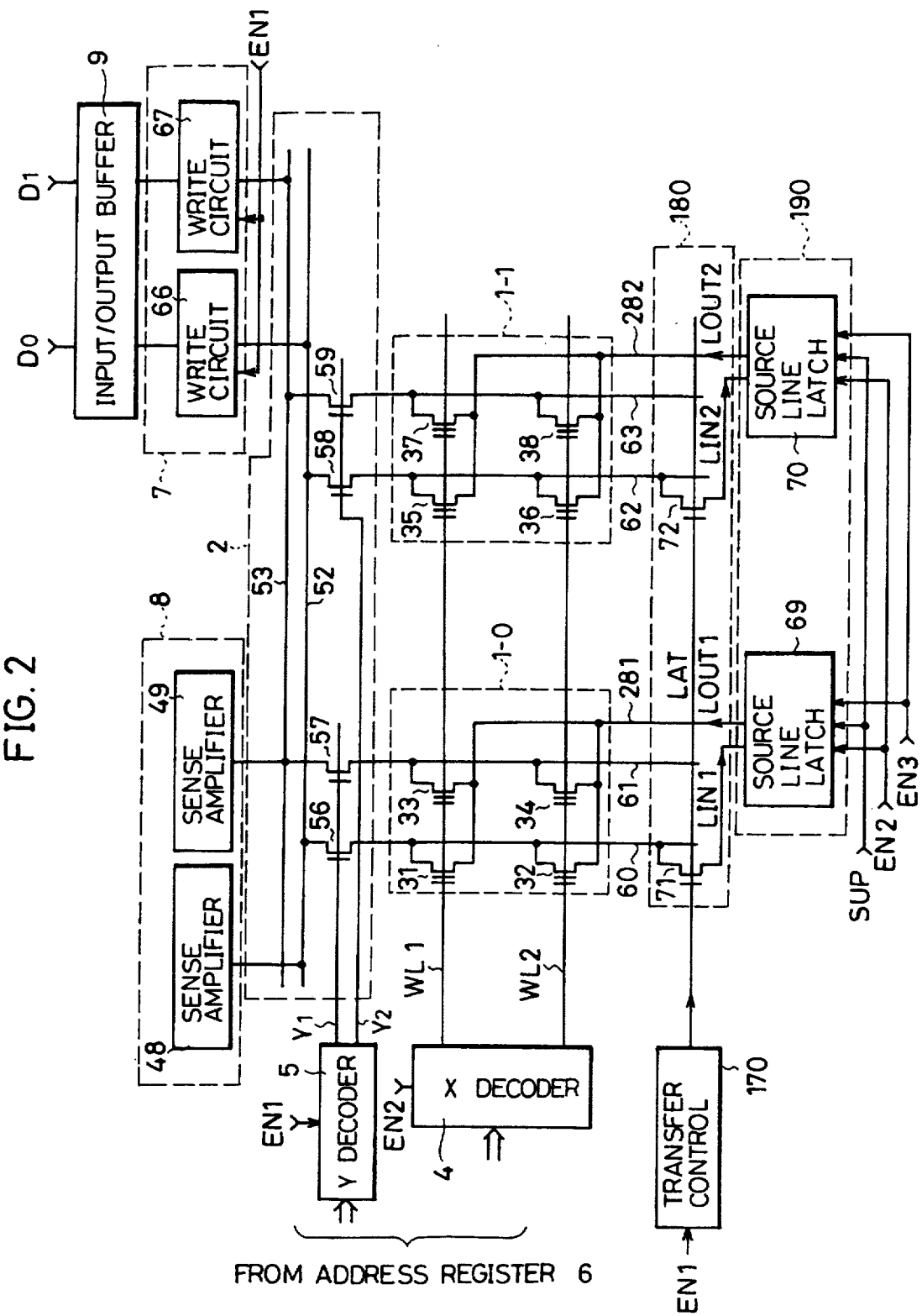
FIG. 2 is a circuit diagram showing a partial structure of the flash EEPROM according to the embodiment.

FIG. 2 is a circuit diagram showing a structure of memory cell array 1 and its peripheral circuitry in a case where memory cell array 1 is constituted by two blocks 1-0 and 1-1 and input/output data is data of 2 bits. FIG. 2 illustrates an example where each memory array block is formed of two memory cell rows.

Figure 9:
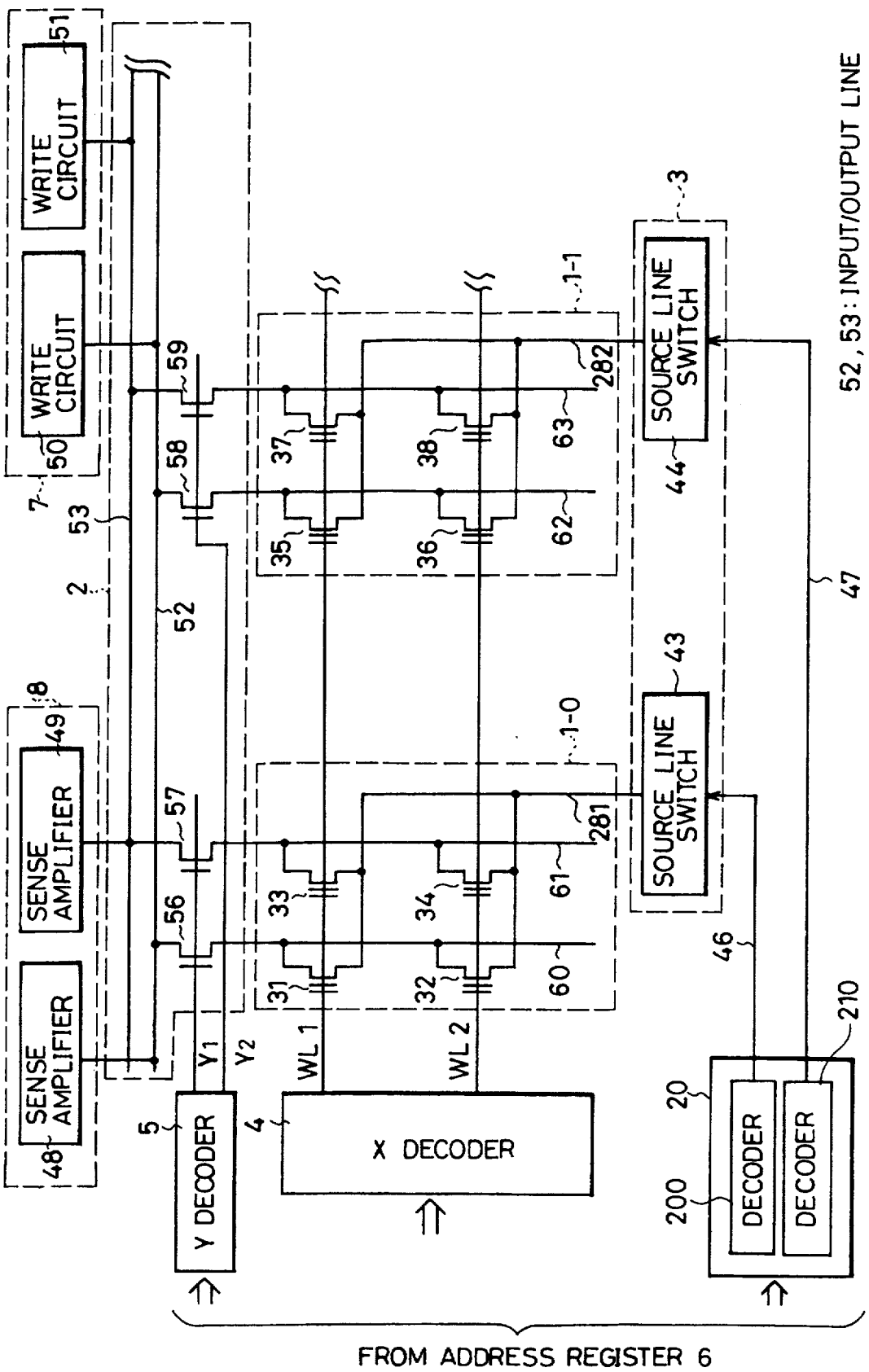
FIG. 9 is a circuit diagram showing a partial structure of the flash EEPROM in the prior art where data can be erased on a block basis.

Referring to FIG. 2, memory cell array blocks 1-0 and 1-1, a Y gate 2, a sense amplifier group 8 and write circuit group 7 have the same structures as those of the prior art shown in FIG. 9. However, each of write circuits 66 and 67 in write circuit group 7 is controlled by the output signal EN1 of command register 13 shown in FIG. 1.

Source line latch portion 190 includes source line latch circuits 69 and 70 provided corresponding to memory cell array blocks 1-0 and 1-1, respectively. Source lines 281 and 282 are separately provided for memory cell array blocks 1-0 and 1-1, respectively, in the same way as in the prior art. The sources of all the memory cells in each memory cell array block are connected to a corresponding source line latch circuit through a corresponding source line.

Transfer gate 180 includes N channel MOS transistors 71 and 72 provided corresponding to memory cell array blocks 1-0 and 1-1, respectively. Each of transistors 71 and 72 in transfer gate 180 is connected between one bit line in a corresponding memory cell array block and a source line latch circuit corresponding to the memory cell array block. More specifically, transistors 71 and 72 in transfer gate 180 are connected to bit lines provided corresponding to memory cells for the same bit.

That is, memory cells 31 and 32 corresponding to a bit line 60 connected to transistor 71 and memory cells 35 and 36 corresponding to a bit line 62 connected to transistor 72 are both connected to an input/output line 52 through transistors 56 and 58 in Y gate 2.

All the transistors 71 and 72 in transfer gate 180 are commonly controlled by a control signal LAT from transfer control circuit 170.

Figure 3:
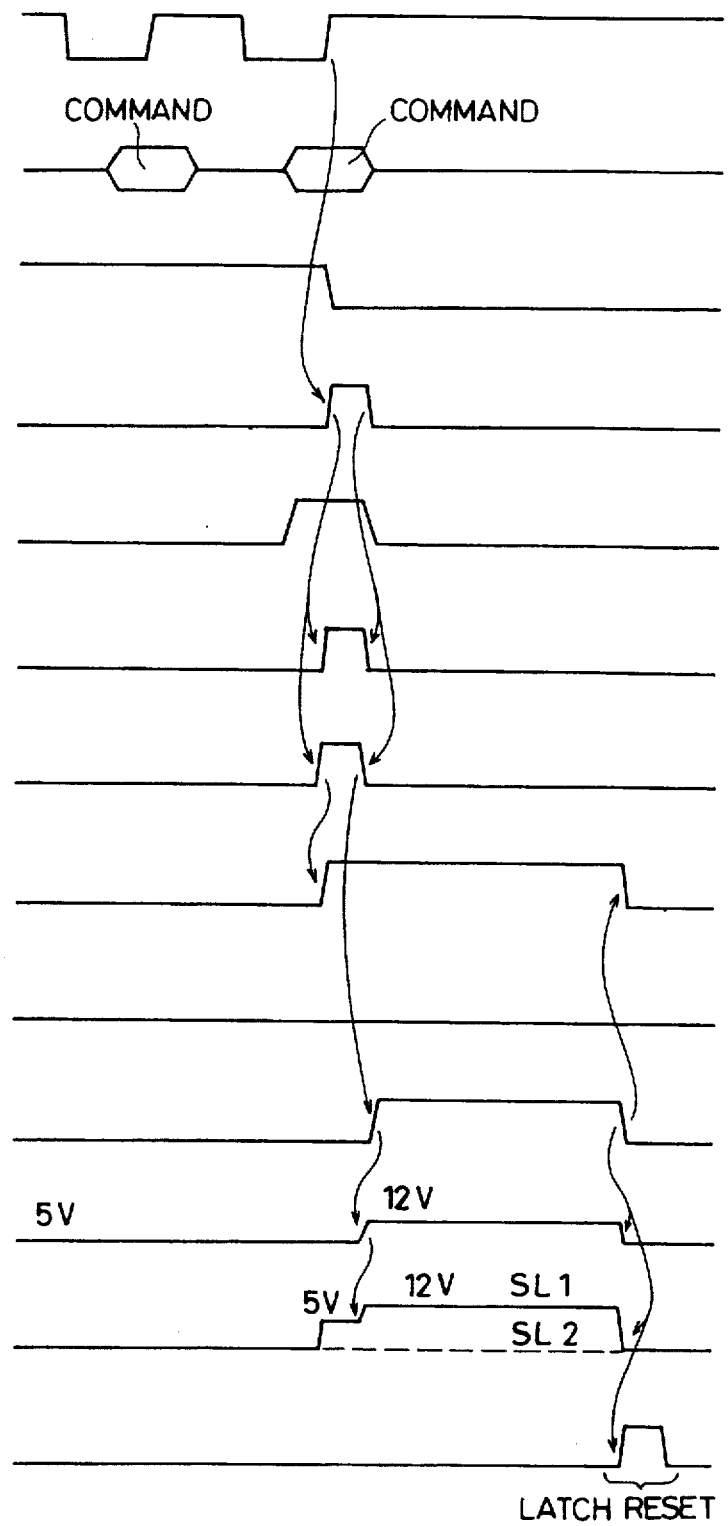
FIG. 3 shows a timing chart for use in describing the operation of the circuit shown in FIG. 2.

A description will now be made of a circuit operation in the erase mode of this flash EEPROM with reference to FIGS. 1 to 3. FIG. 3 is a timing chart showing signal waveforms which appear at some signal lines in the circuitry shown in FIG. 2.

In a flash EEPROM, a command indicated by externally applied data under a predetermined condition determines a mode of the flash EEPROM such as a read mode, a write mode (program mode) and an erase mode. That is, logical values of bits in external data supplied to input/output buffer 9 are predetermined for each mode and if data having such a combination of logical values is supplied to input/output buffer 9 under the predetermined condition, a command register 12 and command decoder 13 sets the flash EEPROM in a mode corresponding to the data.

In this embodiment, let us suppose that a command indicating the erase mode corresponds to data where data $D_0$ externally applied to input/output line 52 through input/output buffer 9 in FIG. 2 has a logical value of "0".

External data Din (FIG. 3(b)) corresponding to the command indicating the erase mode is supplied to input/output buffer 9 after the fall of a write enable signal/WE (FIG. 3(a)) in the same way as in the prior art. Such a command is input twice by causing the write enable signal/WE to fall twice.

Command register 12 supplies to command decoder 13 data Din applied in the second time to input/output buffer 9 as the command indicating the erase mode.

Command decoder 13 decodes data Din from command register 12 after the second fall of the write enable signal/WE for driving a control signal EN2 (FIG. 3(c)) to a low level and for bringing a control signal EN1 (FIG. 3(d)) to a high level for a predetermined period of time, so as to set the flash EEPROM in the erase mode. Furthermore, command decoder 13 drives timer 150 when the control signal EN1 falls and, thereafter, after a certain period of time has passed, generates a control signal EN3 (FIG. 3(m)) which is at a high level for a predetermined period of time.

During the time when the control signal EN1 is at the high level, Y decoder 5 is activated and operates in the same way as in reading data and writing data. That is, in FIG. 2, Y decoder 5 decodes an address signal from address register 6 so as to turn on only transistors in Y gate 2 which are provided corresponding to either one of memory cell array blocks 1-0 and 1-1.

Furthermore, a transfer control circuit 68 is also activated in response to the control signal EN1 attaining the high level. Transfer control circuit 68 is activated and supplies a control signal LAT (FIG. 3(g)) at a high level during the time when the control signal EN1 is at the high level. As a result, all the transistors 71 and 72 in transfer gate 180 turn on while the control signal EN1 is at the high level.

X decoder 4 is deactivated in response to the control signal EN2 attaining a low level. Accordingly, in the erase mode where the control signal EN2 is at the low level, since neither of word lines WL1 and WL2 is selected, all the word lines WL1 and WL2 are substantially at the ground potential.

More specifically, the potential of either one of signal lines Y1 and Y2 provided between Y decoder 5 and Y gate 2 only attains a high level as shown in FIG. 3(f) while the control signal EN1 is at a high level.

Timer 150 keeps supplying a control signal ERASE (FIG. 3(j)) of a high level to power supply switching circuit 160 in response to the fall of the control signal EN1 until the control signal EN3 rises.

Power supply switching circuit 160 supplies a normal power supply voltage (=5 V) to source line latch portion 190 while the control signal ERASE is at the low level, and supplies a high voltage Vpp (=12 V) to source line latch portion 190 while the control signal ERASE is at the high level. Accordingly, an output voltage SUP of power supply switching circuit 160 attains a high voltage Vpp for a certain period of time after the fall of the control signal EN1 as shown in FIG. 3(h).

The data Din received by input/output buffer 9 is supplied to write circuit 7 as well as command register 12.

Write circuits 66 and 67 in write circuit group 7 are activated and operate in the same way as in data writing while the control signal EN1 is at the high level. That is, each of write circuits 66 and 67 supplies a high potential, for example about 6.5 V, to the connected input-/output line only when data of bits corresponding to the connected input/output line 52 or 53 in the data Din including a plurality of bits from input/output buffer 9 "0".

In this embodiment, since the data $D_0$ of the least significant bit in the data Din supplied to input/output buffer 9 as a command indicating the erase mode is "0", the potential on input/output line 52 provided corresponding to the bit $D_0$ is driven high by the operation of the corresponding write circuit 66 as shown in FIG. 3(e) while the control signal EN1 is at the high level.

While the control signal EN1 is at the high level, Y decoder 5 operates, so that the potential on input/output line 52 is transmitted to a bit line in one memory cell array block through any one of the transistors in Y gate 2.

For example, if the potential on signal line Y1 is driven high by Y decoder 5 as shown in FIG. 3(f), the high potential on input/output line 52 is transmitted to bit line 60 in memory cell array block 1-0 through transistor 56.

While the control signal EN is at the high level, transistors 71 and 72 in transfer gate 18 turn on by the operation of transfer control circuit 170, and electrically connect bit lines 60 and 62 in corresponding memory cell array blocks 1-0 and 1-1 to corresponding source line latch circuits 69 and 70, respectively. Accordingly, the high potential transmitted to one bit line in any one of the memory cell array blocks from input/output line 52 is further provided to a source line latch circuit (69 or 70) provided corresponding to the one memory cell array block.

For example, if the high potential on input/output line 52 is transmitted to bit line 60, the high potential is further supplied to source line latch circuit 69 through transistor 71.

Source line latch circuits 69 and 70 are activated in response to the control signal EN2 attaining a low level. Respective source line latch signals 69 and 70 operate so as to hold the potentials on signal lines LIN1 and LIN2 at the high level, once the potentials on the signal lines between the source line latch circuits and corresponding transistors 71 and 72 become high. Such holding operation of each of source line latch circuits 69 and 70 is released when the control signal EN3 attains a high level. That is, the potentials on signal lines LIN1 and LIN2 are reset to a low level in response to the rise of the control signal EN3.

When the control signal EN1 falls, Y decoder 5 and transfer control circuit 170 are both deactivated. As a result, output signals of Y decoder 5 all attain a low level, so that all the transistors 56 to 59 in Y gate 2 are turned off. The output signal of transfer control circuit 170 also attains a low level, so that all the transistors 71 and 72 in transfer gate 180 are turned off. As a result, the high potential on input/output line 52 is not transmitted to any of source line latch circuits 69 and 70. However, each of source line latch circuits 69 and 70 has the holding function as described above.

Accordingly, source line latch circuit 69 or 70 to which the high potential on input output line 52 has been transmitted holds corresponding signal line LIN1 or LIN2 at the high potential even after the fall of the control signal EN1 unless the control signal EN3 attains a high level.

For example, if transistor 56 is turned on while the control signal EN1 is at the high level, the potential on signal line LIN1 is at the high level as shown in FIG. 3(h) and the potential on signal line LIN2 remains at the low level as shown in FIG. 3(i) during the time from the rise of the control signal EN1 to the rise of the control signal EN3.

Furthermore, the activated source line latch circuits 69 and 70 provide as output signals LOUT1 and LOUT2 the output voltage SUP of power supply switching circuit 160 to source lines 281 and 282 in corresponding memory cell array blocks 1-0 and 1-1 while the potentials on corresponding signal lines LIN1 and LIN2 are at the high level, and provide a potential of a low level to corresponding source lines 281 and 282 regardless of the output voltage SUP of power supply switching circuit 160 while the potentials on corresponding signal lines LIN1 and LIN2 are at the low level.

The output voltage SUP of power supply switching circuit 160 is 12 V while the control signal ERASE is at the high level and is 5 V during the other period as shown in FIG. 3(k). Accordingly, for example, if the high potential on input/output line 52 is transmitted to signal line LIN1 while the control signal EN1 is at the high level, the output LOUT1 of source line latch circuit 69 only causes the potential on source line 281 to change in the same way as the output voltage SUP (FIG. 3(k)) of power supply switching circuit 160 as indicated by the solid line in FIG. 3(l). Conversely, the potential on the other source line 282 remains at the low level as indicated by the broken line in FIG. 3(l).

As described above, the high potential of 12 V is only supplied to any one of the source lines while the control signal ERASE is at the high level. Accordingly, data stored in all the memory cells in one memory cell array block where the one source line is provided is only erased collectively and no stored data is erased in memory cells of other memory cell array blocks.

For example, if the potential on source line 281 becomes 12 V while the control signal ERASE is at the high level, the high potential is supplied to the sources of all the memory cells 31 to 34 in memory cell array block 1-0 from source line 281, so that data stored in these memory cells is erased collectively in this period. However, data stored in memory cells 35 to 38 is not erased as the high potential of 12 V is not supplied to any source of memory cells 35 to 38 in memory cell array block 1-1.

As described above, in accordance with this embodiment, either one of source line latch circuits 69 and 70 provided for memory cell array blocks 1-0 and 1-1 is only set to a state where it can provide a high potential Vpp to a corresponding source line 281, 282 by selectively transmitting, in the erase mode, to any one of the bit lines the potential on input/output line 52 corresponding to the bit having the logical value of "0" in the data supplied to the flash EEPROM as a command indicating the erase mode. Accordingly, data stored in any one memory cell array block can only be erased by setting the external address signal so that an address signal supplied from address register 6 to Y decoder 5 in the erase mode designates a column address of a memory cell in the memory cell array block where the stored data is desired to be erased.

As described above, in accordance with this embodiment, since the high potential Vpp for erasing data is only provided to the source line in any one of the memory cell array blocks, it is not necessary to provide source line decoder 20 (see FIG. 8) which receives the address signal as an input as in the prior art. The control signals EN2 and EN3 and the output voltage SUP of power supply switching circuit 160 are commonly received by all the circuits 69 and 70 (corresponding to source line switches 43 and 44 in FIG. 9) provided separately for memory cell array blocks in order to supply the high potential for data erasing to memory cell array blocks 1-0 and 1-1, respectively. Accordingly, there are disposed, regardless of the number of memory cell array blocks, a fixed number (3) of input signal lines to each of circuits 69 and 70 provided for applying an erase pulse.

Therefore, in accordance with this embodiment, since there is no increase in the number of interconnections necessary for erasing stored data in memory cell array 1 on a block basis even if memory cell array 1 is divided into a multiplicity of blocks, the size of each block can be reduced without taking an account of an increase in the number of such interconnections.

If memory cell array 1 is divided into a multiplicity of blocks with its block size reduced, stored data in memory cell array 1 can be erased on a smaller unit basis, so that only part of the stored data can selectively be rewritten.

Although the description above was made of a case where stored data in any one of the memory cell array blocks is selectively erased, an arbitrary number of memory cell array blocks can have data erased collectively.

For example, referring to FIG. 2, if an external address signal is switched so that the potentials on signal lines Y1 and Y2 sequentially attain a high level while the control signal EN1 is at the high level, the high potential on input/output line 52 is firstly held on signal line LIN1 by source line latch circuit 69 and then held on signal line LIN2 by source line latch circuit 70. Accordingly, the high potential of 12 V is supplied to source lines 281 and 282 from source line latch circuits 69 and 70, respectively, while the control signal ERASE is at the high level. As a result, stored data in the two memory cell array blocks 1-0 and 1-1 is erased collectively.

As described above, according to this embodiment, since circuits 69 and 70 each provided for applying an erase pulse to the corresponding memory cell array block have a function of holding a signal indicating the output of the erase pulse, it is also possible to collectively erase stored data in two or more arbitrary memory cell blocks by switching the address signal supplied to Y decoder 5 while Y decoder 5 is in the active state in the erase mode.

In this embodiment, X decoder 4, Y decoder 5, write circuit group 7 and sense amplifier group 8 each operate in the same way as in the prior art in writing data and reading data. Each of source line latch circuits 69 and 70 also operates in the same way as source line switches 43 and 44 of FIG. 9 in writing data and reading data. That is, source line latch circuits 69 and 70 provide a potential of a low level to corresponding source lines 281 and 282 while the control signal EN2 is at the high level.

Therefore, data reading and data writing in this flash EEPROM is performed according to the same circuit operation as in the conventional flash EEPROM.

Figure 4:
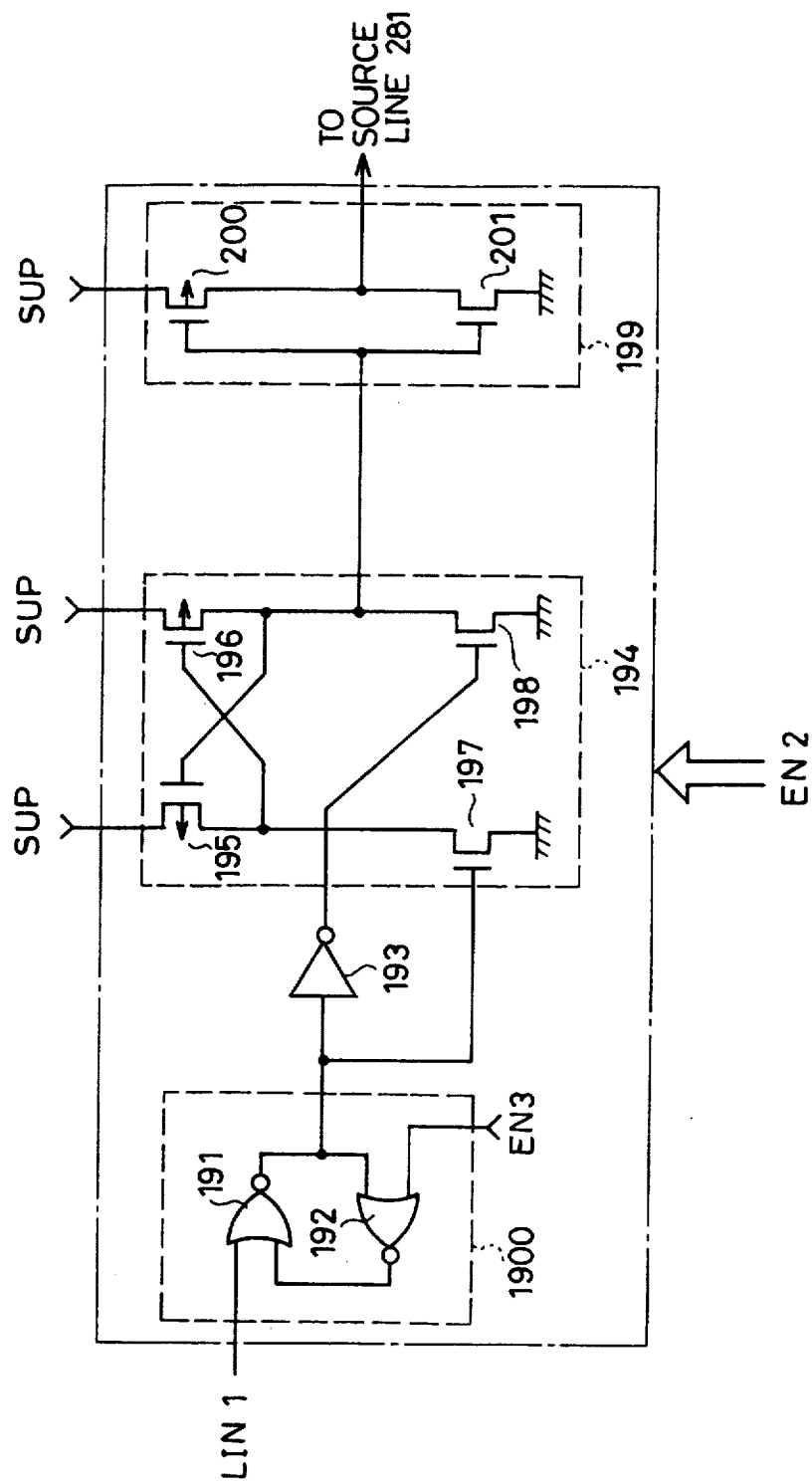
FIG. 4 is a circuit diagram showing an example of a structure of the source line latch circuit in FIG. 2.
Figure 5:
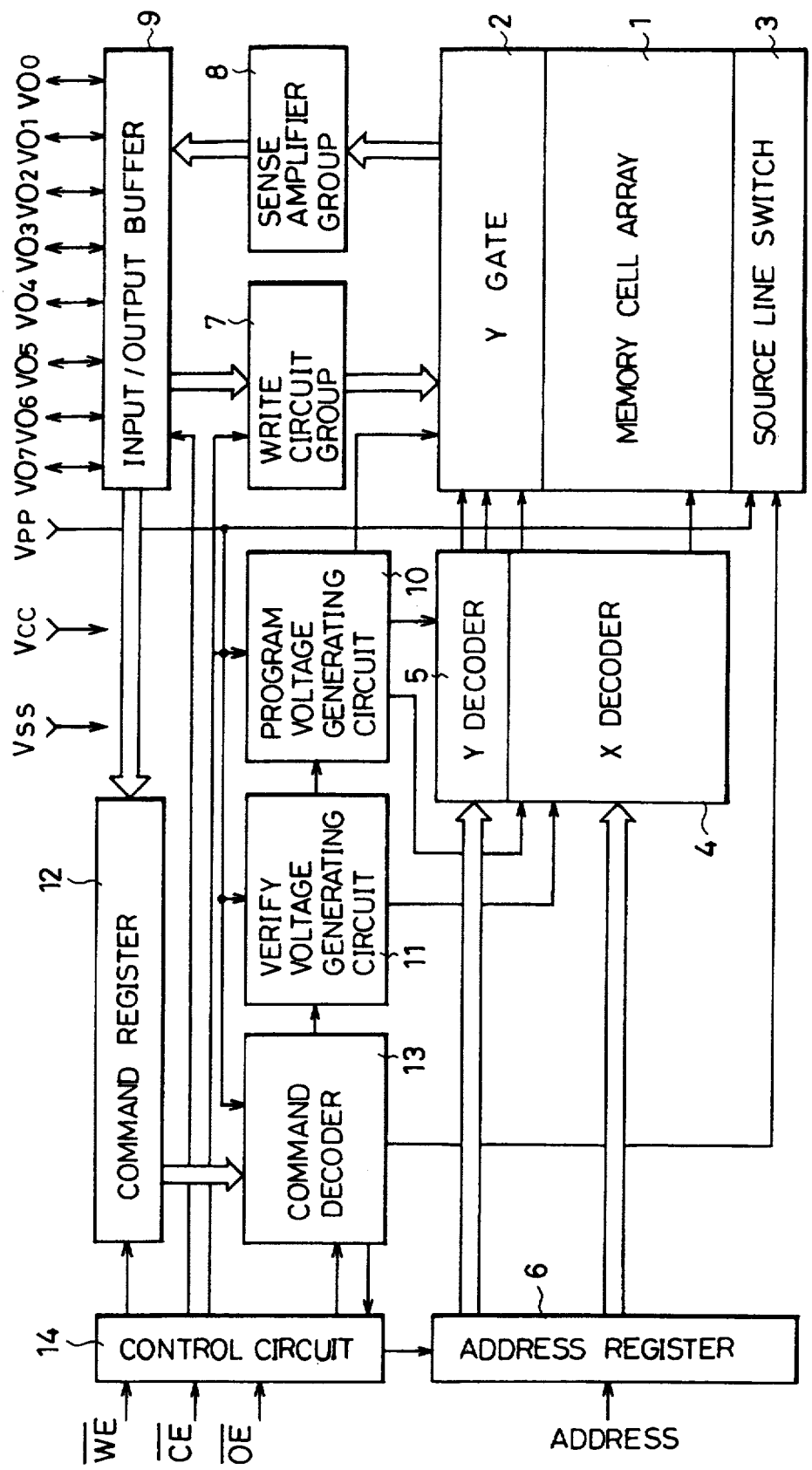
FIG. 5 is a schematic block diagram showing an overall structure of a flash EEPROM in the prior art.
Figure 6:
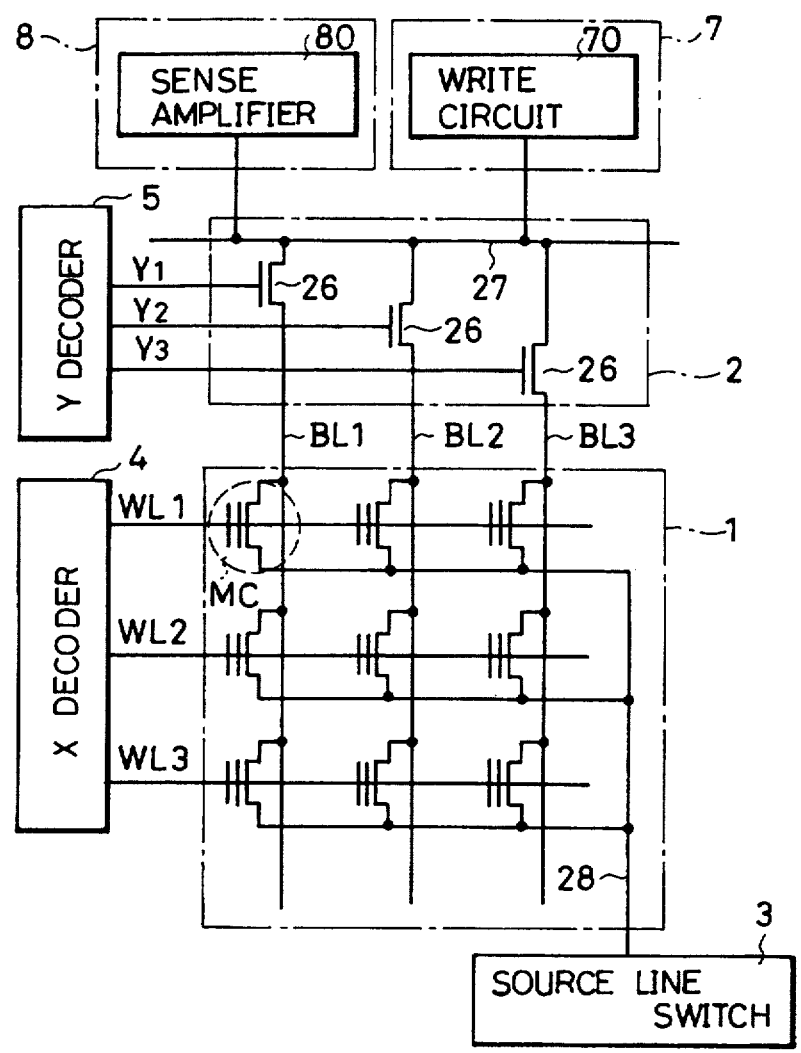
FIG. 6 is a circuit diagram specifically showing the structure of the main portion of the flash EEPROM in the prior art.
Figure 7:
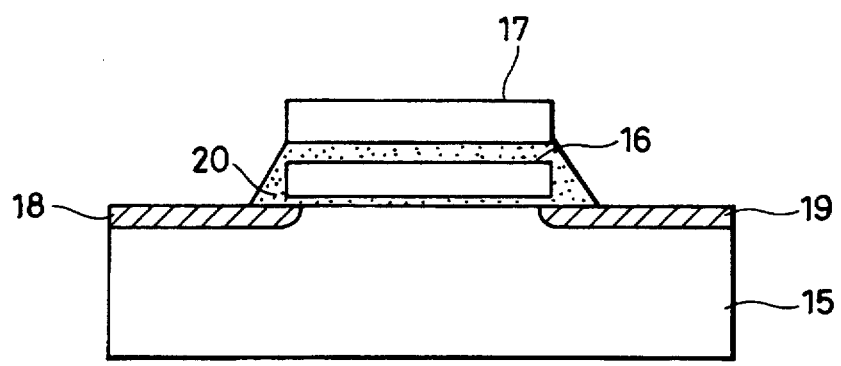
FIG. 7 is a cross-sectional view showing a memory cell structure of the conventional EEPROM.

FIG. 4 is a circuit diagram showing one example of the structure of each of source line latch circuits. FIG. 4 shows the structure of one source line latch circuit 69 as a representative.

Referring to FIG. 4, source line latch circuit 69 includes a flipflop circuit 1900 which receives a potential on a corresponding signal line LIN1 and a control signal EN3 as inputs, an inverter 193, a voltage conversion circuit 194 and a driver circuit 199 for driving a corresponding source line 281.

Flipflop circuit 1900 includes two 2-input NOR gates 191 and 192. NOR gate 191 receives the potential on signal line LIN1 and an output potential of NOR gate 192, and NOR gate 192 receives an output potential of NOR gate 191 and the control signal EN3.

Accordingly, if a high potential on an input/output line 50 is supplied to signal line LIN1 through transistor 56, bit line 60 and transistor 71 in the erase mode, the output potential of NOR gate 191 attains a low level regardless of the output potential of NOR gate 192. Since the control signal EN3 is at a low level when the potential on signal line LIN1 rises (see FIG. 3), the output potential of NOR gate 192 attains a high level in response to the output potential of NOR gate 191 attaining the low level.

As a result, NOR gate 191 receives a potential of a high level from NOR gate 192, so that even if the potential on signal line LIN1 attains a low level the output potential of NOR gate 191 remains at the low level unless the control signal EN3 attains a high level.

The output of NOR gate 191 is supplied to voltage conversion circuit 194 as an output of flipflop circuit 1900 without being inverted. The output of NOR gate 191 supplied to inverter 193 is inverted by the same and then supplied to voltage conversion circuit 194.

Although all the power supply voltages of NOR gates 191 and 192 and inverter 193 are at a normal level (5 V), the power supply voltage of driver 199 becomes high (12 V) while the control signal ERASE is at the high level. Therefore, it is difficult to directly drive driver 199 by the output of flipflop circuit 1900. Voltage conversion circuit 194 is thereby provided in order to increase the current drive capability of an output signal of flipflop circuit 1900.

Voltage conversion circuit 194 includes a P channel MOS transistor 195 and an N channel MOS transistor 197 connected in series between the output voltage SUP of power supply switching circuit 160 shown in FIG. 1 and the ground potential and a P channel MOS transistor 196 and an N channel MOS transistor 198 connected in parallel with those described above. The gate of transistor 197 directly receives the output of flipflop circuit 1900. The output of flipflop circuit 1900 is inverted by inverter 193 and then supplied to the gate of transistor 198. The gates of transistors 195 and 196 are connected to the connecting point between transistors 196 and 198 and the connecting point between transistors 195 and 197, respectively.

Accordingly, if the output potential of flipflop circuit 1900 is at a low level, transistor 198 is turned on, reducing the gate potential of transistor 195 while transistor 197 is turned off, preventing a decrease in the gate potential of transistor 196. As a result, transistor 198 in the ON state causes the input potential to driver 199 to attain a low level.

Driver 199 includes a P channel MOS transistor 200 and an N channel MOS transistor 201 connected in series between the output SUP of power supply switching circuit 160 and the ground potential. The output of voltage conversion circuit 194 is supplied to the gates of transistors 200 and 201 and a connecting point between transistors 200 and 201 is connected to corresponding source line 281.

Accordingly, if the output potential of voltage conversion circuit 194 is at a low level, transistor 200 is turned on, supplying the output voltage SUP of power supply switching circuit 160 to source line 281.

As described above, once the potential on signal line LIN1 attains the high level, the potential of the low level is latched at the connecting point between NOR gates 191 and 192, so that the output voltage SUP of power supply switching circuit 160 is supplied to source line 281 unless the control signal EN3 attains a high level. If the potential of the control signal EN3 attains the high level, the output potential of NOR gate 192 attains a low level regardless of the output potential of NOR gate 191. Accordingly, thereafter, the output potential of NOR gate 191 depends on the potential on signal line LIN1. That is, flipflop circuit 1900 is reset to the state of the time before the potential on signal line LIN1 attained the high level.

Since the output potential of NOR gate 191 is at the high level until a high potential is transmitted to signal line LIN1 from input/output line 52, in contrast with the previous case, transistor 197 is turned on, decreasing the gate potential of transistor 196 while transistor 198 is turned off, preventing a decrease of the gate potential of transistor 195, in voltage conversion circuit 194. Therefore, a potential of a high level from power supply switching circuit 160 is supplied to driver 199 by transistor 196. As a result, in driver 199, transistor 201 is turned on, grounding source line 281.

The control signal EN3 is caused to rise every time the control signal ERASE falls in the erase mode. When the control signal EN3 falls, since the potential on signal line LIN1 is at the low level, the output potential of NOR gate 191 is to a high level. Accordingly, after the control signal EN3 falls, the output potential of flipflop circuit 1900 remains at the high level unless the potential on signal line LIN1 attains a high level in the erase mode. Accordingly, prior to the start of data erasing, source line latch circuit 69 is surely in a state where it can fetch data indicating whether or not to erase stored data in corresponding memory cell array block 1-0.

Although there are separately provided signal lines LIN1 and LIN2 for supplying the potential on input/output line 52 to source line latch circuits 69 and 70 and source lines 281 and 282 for receiving output signals of source line latch circuits 69 and 70 in the embodiment described above, common lines may be provided.

For example, in FIG. 4, input signal line LIN1 to flipflop circuit 1900 may be connected to the output terminal of driver 199. In this case, once the potential on signal line LIN1 attains the high level in the erase mode, it is held at the high potential until the control signal EN3 attains the high level, as shown in FIG. 3(h).

Furthermore, although, according to the embodiment above, the high potential is transmitted to the source line latch circuit from input/output line 52 while the write enable signal/WE is at the low level as shown in FIG. 3, such transmission may be carried out while the write enable signal/WE is at the high level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a plurality of memory cell array blocks each including a plurality of memory cells in each of which data can be electrically written and erased, arranged in a plurality of columns, and a plurality of bit lines provided corresponding to said plurality of columns;
   a plurality of source lines, each corresponding to a memory cell array block and coupled to the plurality of memory cells within a corresponding memory cell array block;
   data bus means to which a potential according to externally applied write data is to be supplied;
   a plurality of first connecting means provided corresponding to said plurality of memory cell array blocks each for electrically connecting said plurality of bit lines in a corresponding memory cell array block to said data bus means;
   a plurality of high voltage generating means provided corresponding to said plurality of memory cell array blocks, and coupled to a corresponding source line and a bit line, each of said plurality of high voltage generating means generating a high voltage for collectively erasing stored data of said plurality of memory cells in a corresponding memory cell array block in response to a potential on the bit line connected by a second connecting means attaining said predetermined potential;
   potential supply means responsive to an indication signal indicating a data erase mode for supplying a predetermined potential to said data bus means;
   activation means for selectively activating any of said plurality of first connecting means in the data erase mode; and
   said second connecting means electrically connecting each of said plurality of high voltage generating means to a predetermined one of said source lines in a corresponding memory cell array block in said data erase mode.

2. The non-volatile semiconductor memory device according to claim 1, wherein each of said plurality of high voltage generating means includes:
   signal holding means responsive to a change of the potential on the source line connected by said second connecting means to said predetermined potential for holding a signal of a first logical level;
   a node to be brought to a predetermined high potential in said data erase mode; and
   switching means responsive to said indication signal for electronically connecting said node to said plurality of memory cells in a corresponding memory cell array block for a certain period of time when the signal of said first logical level is held by said signal holding means, and for electronically disconnecting said node from said plurality of memory cells in the corresponding memory cell array block when the signal of the first logical level is not held by said signal holding means.

3. The non-volatile semiconductor memory device according to claim 2, further comprising potential switching means responsive to said indication signal for supplying said predetermined high potential to said node for a certain period of time and for supplying to said node a potential sufficiently lower than said predetermined high potential for other period of time.

4. The non-volatile semiconductor memory device according to claim 2, wherein said signal holding means further includes reset means for resetting said held signal to a second logical level after said certain period of time has passed.

5. The non-volatile semiconductor memory device according to claim 1, wherein said data bus means includes a plurality of data lines provided commonly for said plurality of memory cell array blocks and also provided corresponding to said plurality of bit lines in each of said memory cell array blocks, respectively, and
each of said plurality of first connecting means includes a plurality of first switching means provided between said plurality of bit lines in a corresponding memory cell array block and the corresponding data lines.

6. The non-volatile semiconductor memory device according to claim 5, wherein said predetermined one of said plurality of bit lines in each of said plurality of memory cell array blocks is provided corresponding to the same data line, and
said potential supply means supplies said predetermined one potential to the data line corresponding to said predetermined one bit line in response to said indication signal.

7. The non-volatile semiconductor memory device according to claim 5, wherein said activation means includes first control means responsive to said indication signal for only bringing to an ON state said plurality of first switching means provided between said plurality of bit lines in any one of said plurality of memory cell array blocks and the corresponding data line for a predetermined period of time.

8. The non-volatile semiconductor memory device according to claim 7, wherein said first control means comprises a decode means which is activated in response to said indication signal for decoding an address signal.

9. The non-volatile semiconductor memory device according to claim 6, wherein said second connecting means includes:
a plurality of second switching means provided corresponding to said plurality of memory cell array blocks and each provided between said predetermined one of a plurality of source lines in a corresponding memory cell array block and corresponding high voltage generating means; and
second control means responsive to said indication signal for turning on all of said plurality of second switching means.

10. The non-volatile semiconductor memory device according to claim 1, wherein each of said plurality of memory cells includes a field-effect semiconductor element having a control gate region, a floating gate region, a drain region connected to a bit line corresponding to a column where it is arranged and a source region,
the source regions of all the memory cells included in each of said plurality of memory cell array blocks are connected to a corresponding high voltage generating means through a common signal line, and
the control gate regions of all of the memory cells included in each of said plurality of memory cell array blocks are forced to a predetermined low potential in said data erase mode.

11. A non-volatile semiconductor memory device comprising:
a plurality of memory cell array blocks each including a plurality of memory cells in each of which data can be electrically written and erased arranged in a plurality of columns and a plurality of rows, a plurality of bit lines provided corresponding to said plurality of columns, and a plurality of word lines provided corresponding to said plurality of rows;
a plurality of source lines, each corresponding a memory cell array block and coupled to the plurality of memory cells within a memory cell array block;
data bus means to which a potential according to externally applied write data is to be supplied in data writing;
a plurality of first connecting means provided corresponding to said plurality of memory cell array blocks each for electrically connecting each of said plurality of bit lines in a corresponding memory cell array block to said data bus means;
a plurality of high voltage generating means provided corresponding to said plurality of memory cell array blocks, and coupled to a corresponding source line, each of said plurality of high voltage generating means generating a high voltage for collectively erasing stored data of said plurality of memory cells in a corresponding memory cell array block in response to a bit line connected by a second connecting means attaining said predetermined potential;
potential supply means for supplying a predetermined potential to said data bus means in a data erase mode;
first decode means for decoding an address signal so as to generate a signal for activating any of said plurality of first connecting means and deactivating all the other of said plurality of first connecting means in each of a data write mode, a data read mode and said data erase mode;
said second connecting means electrically connecting each of said plurality of high voltage generating means to a predetermined one of said plurality of source lines in a corresponding memory cell array block in said data erase mode; and
second decode means for decoding said address signal, bringing to a selected state any of said plurality of word lines in each of said plurality of memory cell array blocks in said data write mode and said data read mode and bringing to a non-selected state all of said plurality of word lines in each of said plurality of memory cell array blocks in said data erase mode.

12. The non-volatile semiconductor memory device according to claim 11, wherein said data bus means includes a plurality of data lines provided commonly for said plurality of memory cell array blocks and for said plurality of bit lines included in each of said plurality of memory cell array blocks,
each of said plurality of first connecting means includes a plurality of switching means provided between said plurality of bit lines in a corresponding memory cell array block and the corresponding data lines, and said predetermined potential is supplied to the data line provided corresponding to said predetermined one of said plurality of bit lines.

13. A method of erasing data on a block basis in a non-volatile semiconductor memory device comprising a plurality of memory cell array blocks each including a plurality of memory cells in each of which data can be electrically written and erased, arranged in a plurality of columns and rows, a plurality of bit lines provided corresponding to said plurality of columns and plurality of word lines provided corresponding to said plurality of rows, a plurality of source lines, each corresponding a memory cell array block and coupled to the plurality of memory cells within the memory cell array block; data bus means to which a potential according to external applied write data is to be supplied, a plurality of connecting means provided corresponding to said plurality of memory cell array blocks each for electrically connecting said plurality of bit lines in a corresponding memory cell array block to said data bus means, and a plurality of high voltage generating means provided corresponding to said plurality of memory cell array blocks each of generating a high voltage for collectively erasing stored data of said plurality of memory cells in a corresponding memory cell array block, said method comprising the steps of:

supplying a predetermined signal to said data bus means;

forcing all of said plurality of word lines to a predetermined low potential;

selectively activating any of said plurality of connecting means;

electrically connecting each of said plurality of high voltage generating means to the source line in a corresponding memory cell array block; and activating at least one of said plurality of high voltage generating means in response to the bit line corresponding to the memory cell array block being supplied with said predetermined signal through an activated one of said connecting means.

14. A non-volatile semiconductor memory device, comprising:

a plurality of memory cell array blocks each including a plurality of memory cells in each of which data can be electrically written and erased, arranged in a plurality of columns and a plurality of bit lines provided corresponding to said plurality of columns;

data bus means to which a potential according to externally applied write data is to be supplied;

a plurality of first connecting means provided corresponding to said plurality of memory cell array blocks each for electrically connecting said plurality of bit lines in a corresponding memory cell array block to said data bus means;

a plurality of high voltage generating means provided corresponding to said plurality of memory cell array blocks each for generating a high voltage for collectively erasing stored data of said plurality of memory cells in a corresponding memory cell array block; each of said plurality of high voltage generating means including:

signal holding means responsive to a change of the potential on a bit line connected by said second connecting means to said predetermined potential for holding a signal of a first logical level;

a node to be brought to a predetermined high potential in said data erase mode; and switching means responsive to said indication signal for electronically connecting said node to said plurality of memory cells in a corresponding memory cell array block for a certain period of time when the signal of said first logical level is held by said signal holding means, and for electronically disconnecting said node from said plurality of memory cells in the corresponding memory cell array block when the signal of the first logical level is not held by said signal holding means;

potential supply means responsive to an indication signal indicating a data erase mode for supplying a predetermined potential to said data bus means;

activating means for selectively activating any of said plurality of first connecting means in the data erase mode; and second connecting means for electrically connecting each of said plurality of high voltage generating means to a predetermined one of said plurality of bit lines in a corresponding memory cell array block in said data erase mode, each of said plurality of high voltage generating means being activated in response to a potential on the bit line connected by said second connecting means attaining said predetermined potential.

15. The non-volatile semiconductor memory device according to claim 14, further comprising potential switching means responsive to said indication signal for supplying said predetermined high potential to said node for a certain period of time and for supplying to said node a potential sufficiently lower than said predetermined high potential for other period of time.

16. The non-volatile semiconductor memory device according to claim 14, wherein said signal holding means further includes reset means for resetting said held signal to a second logical level after said certain period of time has passed.

17. The non-volatile semiconductor memory device according to claim 14, wherein said data bus means includes a plurality of data lines provided commonly for said plurality of memory cell array blocks and also provided corresponding to said plurality of bit lines in each of said memory cell array blocks, respectively, and each of said plurality of first connecting means includes a plurality of first switching means provided between said plurality of bit lines in a corresponding memory cell array block and the corresponding data lines.

18. The non-volatile semiconductor memory device according to claim 17, wherein said predetermined one of said plurality of bit lines in each of said plurality of memory cell array blocks is provided corresponding to the same data line, and said potential supply means supplies said predetermined potential to the data line corresponding to said predetermined one bit line in response to said indication signal.

19. The non-volatile semiconductor memory device according to claim 17, wherein said activation means includes first control means responsive to said indication signal for only bringing to an ON state said plurality of first switching means provided between said plurality of bit lines in any one of said plurality of memory cell array blocks and the corresponding data line for a predetermined period of time.

20. The non-volatile semiconductor memory device according to claim 19, wherein said first control means is decode means which is activated in response to said indication signal for decoding an address signal.

21. The non-volatile semiconductor memory device according to claim 18, wherein said second connecting means includes:

a plurality of second switching means provided corresponding to said plurality of memory cell array blocks and each provided between said predetermined one bit line in a corresponding memory cell array block and corresponding high voltage generating means; and second control means responsive to said indication signal for turning on all of said plurality of second switching means.

22. The non-volatile semiconductor memory device according to claim 14, wherein each of said plurality of memory cells includes a field-effect semiconductor element having a control gate region, a float gate region, a drain region connected to a bit line corresponding to a column where it is arranged and a source region, the source regions of all the memory cells included in each of said plurality of memory cell array blocks are connected to a corresponding high voltage generating means through a common signal line, and the control gate regions of all of the memory cells included in each of said plurality of memory cell array blocks are forced to a predetermined low potential in said data erase mode.

* * * * *